United States Patent
Kim et al.

(10) Patent No.: US 11,588,103 B2
(45) Date of Patent: Feb. 21, 2023

(54) RESISTIVE MEMORY ARRAY

(71) Applicant: International Business Machines Corporation, Armonk, NY (US)

(72) Inventors: Youngseok Kim, Upper Saddle River, NJ (US); Choonghyun Lee, Rensselaer, NY (US); Timothy Mathew Philip, Albany, NY (US); Soon-Cheon Seo, Glenmont, NY (US); Injo Ok, Loudonville, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 17/104,405

(22) Filed: Nov. 25, 2020

(65) Prior Publication Data
US 2022/0165947 A1 May 26, 2022

(51) Int. Cl.
*H01L 45/00* (2006.01)
*H01L 27/24* (2006.01)

(52) U.S. Cl.
CPC ........ *H01L 45/1233* (2013.01); *H01L 27/249* (2013.01); *H01L 45/1253* (2013.01); *H01L 45/1683* (2013.01)

(58) Field of Classification Search
CPC ............... H01L 45/1233; H01L 27/249; H01L 45/1253; H01L 45/1683
See application file for complete search history.

(56) References Cited

U.S. PATENT DOCUMENTS

| | | | |
|---|---|---|---|
| 8,546,861 | B2 | 10/2013 | Hwang |
| 9,087,987 | B2 | 7/2015 | Krebs et al. |
| 9,412,445 | B1 | 8/2016 | Chen |
| 9,530,493 | B2 | 12/2016 | Eleftheriou et al. |
| 9,698,202 | B2 | 7/2017 | Takaki |

(Continued)

FOREIGN PATENT DOCUMENTS

| | | |
|---|---|---|
| CN | 103325414 A | 9/2013 |
| CN | 103378290 A | 10/2013 |

(Continued)

OTHER PUBLICATIONS

A Highly Parallel and Energy Efficient Three-Dimensional Multilayer CMOS-RRAM Accelerator for Tensorized Neural Network, Huang et al., IEEE Transactions on Nanotechnology, 2018.

(Continued)

*Primary Examiner* — Shih Tsun A Chou
(74) *Attorney, Agent, or Firm* — Matthew Zehrer

(57) ABSTRACT

A vertical resistive memory array is presented. The array includes a pillar electrode and a switching liner around the side perimeter of the pillar electrode. The array includes two or more vertically stacked single cell (SC) electrodes connected to a first side of the switching liner. The juxtaposition of the switching liner, the pillar electrode, and each SC electrode forms respective resistance switching cells (e.g., OxRRAM cell). A vertical group or bank of these cells may be connected in parallel and each share the same pillar electrode. The cells in the vertical cell bank may written to or read from as a group to limit the effects of inconsistent CF formation of any one or more individual cells within the group.

8 Claims, 15 Drawing Sheets

(56) References Cited

U.S. PATENT DOCUMENTS

| | | | |
|---|---|---|---|
| 10,497,752 B1 | 12/2019 | Ando et al. | |
| 10,658,582 B2 | 5/2020 | Ando et al. | |
| 2013/0229855 A1* | 9/2013 | Kwak | G11C 13/0097 |
| | | | 365/148 |
| 2020/0258572 A1* | 8/2020 | Bandyopadhyay | |
| | | | H01L 27/2427 |

FOREIGN PATENT DOCUMENTS

| | | |
|---|---|---|
| CN | 104716259 A | 6/2015 |
| CN | 106448727 A | 2/2017 |
| CN | 108346446 A | 7/2018 |

OTHER PUBLICATIONS

Universal understanding of direct current transport properties of ReRAM based on a parallel resistance model, Kinoshita et al., Journal of Materials Research, Feb. 2008.
A Parallel Circuit Model for Multi-State Resistive-Switching Random Access Memory, Chen et al., Advanced Functional Materials; 2012.
Notification of transmittal of the international search reportand the written opinion of the international searching authority, PCT/CN 2021/125235, dated Jan. 18, 2022.

* cited by examiner

RESISTIVE MEMORY ARRAY

FIELD

Embodiments of the invention relate generally to the field of semiconductor devices and, more particularly, to a non-volatile resistive random access memory (ReRAM) array.

BACKGROUND

Generally, ReRAM is based on a sandwich structure, or cell, that includes a first electrode, switching layer, and second electrode. When a specific voltage is deliberately applied, reversible and repeatable resistance change is achieved by controlling the connection and rupture of a conductive filament (CF) in the switching layer.

When the CF is connected to the electrodes, the ReRAM device shows high conductivity and is in a low resistance state (LRS). When the CF is disconnected from the electrodes with a gap, the ReRAM is in a high resistance state (HRS). According to the composition of the CF ament, the ReRAM can be classified into an oxygen vacancy based ReRAM (OxRRAM) or metal ion based ReRAM (also called conductive bridge random access memory, CBRAM).

CBRAM's resistive mechanisms are explained by the metal ion formation and connection to the electrodes which has been observed and confirmed by a microscopic scope. The resistive switching of mechanism of OxRRAM is relatively more theoretical and has been explained in terms of the migration of oxygen vacancies, which are activated by a combined effect of electric field and thermal effect.

The migration of oxygen vacancies is stochastic in nature. Therefore, the resistance change of OxRRAM is stochastic, due to inconsistent CF formation. Inconsistent CF formation may be seen as CF formation failure (e.g., HRS of the OxRRAM cell when a LRS is intended), may be seen as CF over formation (e.g., LRS of the OxRAM cell when a HRS is intended), or variable CF formation over a range of cells (e.g., differing low resistance values and/or high resistance values across a range of OxRAM cells).

SUMMARY

In an embodiment of the present invention, a vertical resistive memory array is presented. The vertical resistive memory array includes a front vertical resistive memory unit that includes a front resistive random access memory (ReRAM) pillar and a first vertically stacked electrode group connected to a first side of the front ReRAM pillar. The front ReRAM pillar includes a first pillar electrode and a first switching liner around and contacting a sidewall perimeter of the first pillar electrode. The first vertically stacked electrode group includes a first upper single cell (SC) electrode in contact with the first switching liner and a first lower SC electrode in contact with the first switching liner.

In another embodiment of the present invention, a vertical resistive memory array method is presented. The method includes receiving, with a memory controller, a read request to obtain data stored in a single memory cell from a requesting device. The method includes applying, with the memory controller, a read potential to a vertical resistive memory unit that comprises a plurality of ReRAM cells that share the same pillar electrode. The method includes determining, with the memory controller, an equivalent resistance of the vertical resistive memory unit. The method includes determining, with the memory controller, a resistance state of the vertical resistive memory unit. The method further includes returning, with the memory controller, a data value that is associated with the determined resistance state of the vertical resistive memory unit to the requesting device.

In another embodiment of the present invention, a vertical resistive memory array method is presented. The method includes receiving, with a memory controller, a read request to obtain data stored in a single memory cell from a requesting device. The method includes applying, with the memory controller, a read potential to a vertical resistive memory unit that comprises a plurality of ReRAM cells that share the same pillar electrode. The method includes determining, with the memory controller, a resistance of the each of the plurality of ReRAM cells in the vertical resistive memory unit. The method includes determining, with the memory controller, a combined resistance of each resistance of the plurality of ReRAM cells in the vertical resistive memory unit. The method further includes determining, with the memory controller, a resistance state of the vertical resistive memory unit from the combined resistance and returning, with the memory controller, a data value that is associated with the determined resistance state of the vertical resistive memory unit to the requesting device.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Figure 1:
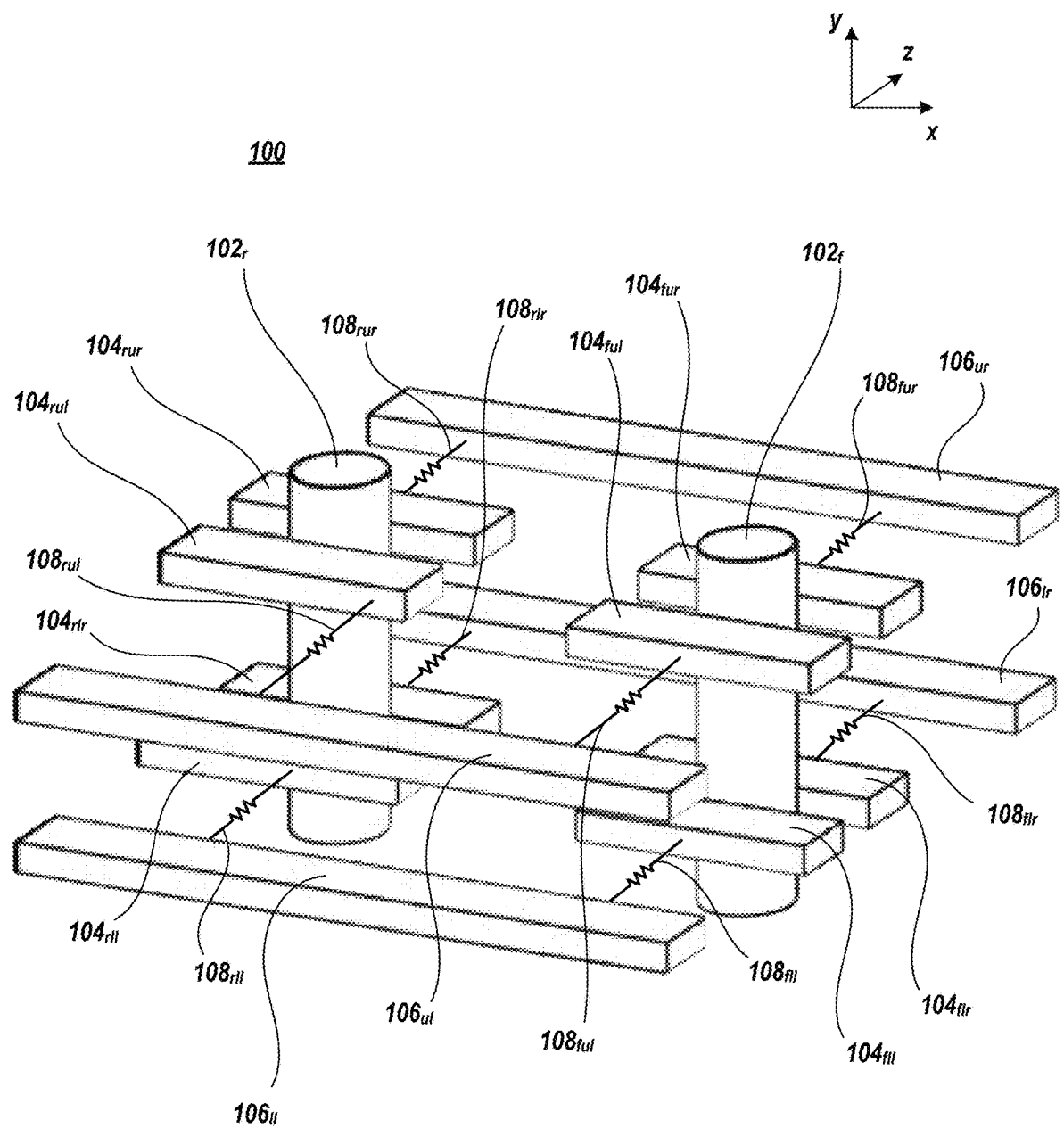
FIG. 1 is a perspective view of a vertical resistive memory array 100, in accordance with embodiments of the present invention.

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description and drawings, details of well-known features and techniques may be omitted to avoid unnecessarily obscuring the presented embodiments.

Referring to the drawings, wherein like components are labeled with like numerals, exemplary fabrication steps of forming an IC device that includes one or more ReRAM memory cells 100, are shown and described in greater detail below. It should be noted that while this description may refer to some components of the IC device in the singular tense, more than one component may be included within the IC device. The specific components depicted in the drawings and the cross section orientation was chosen to best illustrate the various embodiments described herein.

A vertical resistive memory array is presented. The array includes a pillar electrode and a switching liner around the side perimeter of the pillar electrode. The array includes two or more vertically stacked single cell (SC) electrodes connected to a first side of the switching liner. The juxtaposition of the switching liner, the pillar electrode, and each SC electrode forms respective resistance switching cells (e.g., OxRRAM cell). A vertical group or bank of these cells may be connected in parallel and each share the same pillar electrode. The cells in the vertical cell bank may written to, read from, reset, or the like, as a group to limit the effects of inconsistent CF formation of any one or more individual cells within the group.

For clarity, various numerals are referenced herein. When a numeral is followed by a subscript, a specific instance of the numeral element is being referred to. When a numeral does not include a subscript, the numeral element is generically being referred to.

FIG. 1 is a perspective view of a vertical resistive memory array 100, in accordance with embodiments of the present invention.

Figure 2A:
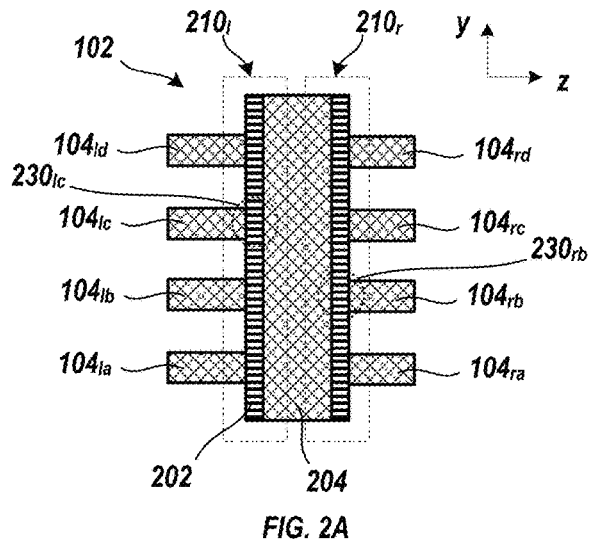
FIG. 2A depicts a cross section of a vertical resistive memory unit, in accordance with various embodiments of the present invention.

The vertical resistive memory array 100 may include ReRAM pillars 102 and vertically stacked, also referred to herein as vertically aligned, single cell (SC) electrodes 104 connected to the ReRAM pillars 102, respectively. The ReRAM pillars 102 include a switching liner 202 around the perimeter of a conductive pillar electrode 204, as depicted in FIG. 2A. The juxtaposition between the switching liner 202, the pillar electrode 204, and each SC electrode 104 forms a respective ReRAM cell. The vertical resistive memory array 100 may further include vertically stacked multiple cell (MC) electrodes 106 connected to at least two SC electrodes 104 by a high resistance element (HRE) 108, respectively.

For example, vertical resistive memory array 100 may include a front ReRAM pillar 102$f$ and a rear ReRAM pillar 102$_r$. The vertical resistive memory array 100 may include vertically stacked SC electrode 104$_{flr}$ and vertically stacked SC electrode 104$_{fur}$ connected to the front ReRAM pillar 102$f$. The vertical resistive memory array 100 may further include vertically stacked SC electrode 104$_{fll}$ and vertically stacked SC electrode 104$_{ful}$ connected to the front ReRAM pillar 102$_f$. Similarly, the vertical resistive memory array 100 may include vertically stacked SC electrode 104$_{rlr}$ and vertically stacked SC electrode 104$_{rur}$ connected to the rear ReRAM pillar 102$_r$. Likewise, the vertical resistive memory array 100 may further include vertically stacked SC electrode 104$_{rll}$ and vertically stacked SC electrode 104$_{rul}$ connected to the rear ReRAM pillar 102$_r$.

The vertical resistive memory array 100 may further include vertically stacked MC electrode 106$_{lr}$ and MC electrode 106$_{ur}$ and may further include vertically stacked MC electrode 106$_{ll}$ and MC electrode 106$_{ul}$. MC electrode 106$_{lr}$ may be connected to SC electrode 104$_{flr}$ by HRE 108$_{flr}$ and may be connected to SC electrode 104$_{rlr}$ by HRE 108$m$. MC electrode 106$_{ur}$ may be connected to SC electrode 104$_{fur}$ by HRE 108$_{fur}$ and may be connected to SC electrode 104$_{rur}$ by HRE 108$_{rur}$. MC electrode 106$_{ll}$ may be connected to SC electrode 104$_{fll}$ by HRE 108$_{fll}$ and may be connected to SC electrode 104$_{rll}$ by HRE 108$_{rll}$. MC electrode 106$_{ul}$ may be connected to SC electrode 104$_{ful}$ by HRE 108$_{ful}$ and may be connected to SC electrode 104$_{rul}$ by HRE 108$_{rul}$.

SC electrode 104$_{flr}$, SC electrode 104$_{fll}$, SC electrode 104$_{rlr}$, SC electrode 104$_{rll}$, MC electrode 106$_{lr}$, MC electrode 106$_{ll}$, HRE electrode 108$_{flr}$, HRE electrode 108$_{fll}$, HRE electrode 108$_{rlr}$, and/or HRE electrode 108$_{rll}$ may be in the same lower wiring level. For example, the respective top surfaces of such elements may be coplanar and the respective bottom surfaces of such elements may be coplanar.

Similarly, SC electrode 104$_{fur}$, SC electrode 104$_{ful}$s, SC electrode 104$_{rur}$, SC electrode 104$_{rul}$, MC electrode 106$_{ur}$, MC electrode 106$_{ul}$, HRE electrode 108$_{fur}$, HRE electrode 108$ful$, HRE electrode 108$_{rur}$, and/or HRE electrode 108$_{rul}$ may be in the same upper wiring level. For example, the respective top surfaces of such elements may be coplanar and the respective bottom surfaces of such elements may be coplanar.

While the embodiment illustrated in FIG. 1 illustrates that the vertical resistive memory array 100 includes the pair of ReRAM pillars 102 and associated other vertically aligned wiring features, it is to be understood that this specific configuration is not required and that other alternative configurations are possible. For example, the vertical resistive memory array 100 can include additional ReRAM pillars 102 and associated other vertically aligned wiring features and/or additional vertically aligned wiring features associated with the pair of ReRAM pillars 102, or the like.

Vertical distances between the wiring levels can vary according to multiple factors and requirements. Similarly, the longitudinal lengths between wiring features may vary according to multiple factors and requirements. In addition, it is to be understood that each SC electrode 104 and MC electrode 106, may be patterned conductive elements and can be formed of a first conductor material, such as Copper (Cu), Tungsten (W), or the like and HRE 108 may be patterned conductive elements and can be formed of a second conductor material, such as Tantalum nitride (TaN), Titanium nitride (TiN), or the like that has a resistance higher than the first conductor.

It is to be further understood that a MC electrode 106, two or more SC electrodes 104, and two or more associated HRE 108 are electrically connected. For example, MC electrode $106_{ul}$ is electrically connected to and thus communicative with HRE $108_{ful}$, is electrically connected to and thus communicative with HRE $108_{rul}$. HRE $108_{ful}$ is electrically connected to and thus communicative with SC electrode $104_{ful}$. HRE $108_{rul}$ is electrically connected to and thus communicative with SC electrode $104_{rul}$.

It is to be understood that the vertical resistive memory array 100 can be operably disposed above a first metallization level and below a second metallization level in a wafer assembly. One or more of the features of vertical resistive memory array 100 may provide for electrical connection and communication between various components of at least the first and second metallization levels of the wafer assembly.

FIG. 2A depicts a cross section of a vertical resistive memory unit 210, in accordance with various embodiments of the present invention. A vertical resistive memory unit 210 generally includes a single ReRAM pillar 102 and a vertically stacked SC electrode 104 in an upper wiring level and a SC electrode 104 in a lower wiring level. The juxtaposition between the switching liner 202 of the ReRAM pillar 102, the pillar electrode 204 of the ReRAM pillar 102, and each SC electrode 104 forms a respective ReRAM cell 230. A first group of vertically stacked SC electrodes 104 may contact a first side of ReRAM pillar 102 and a second group of vertically stacked SC electrodes 104 may contact a second side of ReRAM pillar 102.

For example, vertical resistive memory unit $210_l$ includes SC electrode $104_{la}$, SC electrode $104_{lb}$, SC electrode $104_{lc}$, SC electrode $104_{ld}$ and ReRAM pillar 102. The juxtaposition between the switching liner 202, the pillar electrode 204, and SC electrode $104_{la}$ forms a respective ReRAM cell $230_{la}$. Similarly, the juxtaposition between the switching liner 202, the pillar electrode 204, and SC electrode $104_{lb}$ forms a respective ReRAM cell $230_{lb}$. ReRAM cell $230_{lc}$ and ReRAM cell $230_{ld}$ are similarly formed. As such, vertical resistive memory unit $210_l$ includes a bank or grouping of vertically aligned ReRAM cells 230 that include ReRAM cell $230_{la}$, ReRAM cell $230_{lb}$, ReRAM cell $230_{lc}$ and ReRAM cell $230_{ld}$.

Similarly, vertical resistive memory unit $210_r$ includes SC electrode $104_{ra}$, SC electrode $104_{rb}$, SC electrode $104_{rc}$, SC electrode $104_{rd}$ and the same ReRAM pillar 102 that is associated with vertical resistive memory unit $210_l$. The juxtaposition between the switching liner 202, the pillar electrode 204, and SC electrode $104_{ra}$ forms a respective ReRAM cell $230_{ra}$. Similarly, the juxtaposition between the switching liner 202, the pillar electrode 204, and SC electrode $104_{rb}$ forms a respective ReRAM cell $230_{rb}$. ReRAM cell $230_{rc}$ and ReRAM cell $230_{rd}$ are similarly formed. As such, vertical resistive memory unit $210_r$ includes a bank or grouping of vertically aligned ReRAM cells 230 that include ReRAM cell $230_{ra}$, ReRAM cell $230_{rb}$, ReRAM cell $230_{rc}$ and ReRAM cell $230_{rd}$.

Figure 2B:
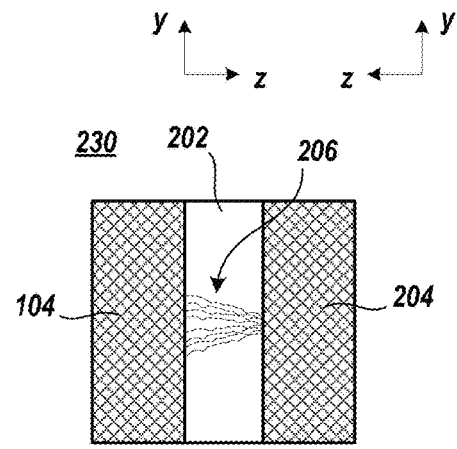
FIG. 2B depicts a cross section of an ReRAM cell, in accordance with various embodiments of the present invention.

FIG. 2B depicts a cross section of an ReRAM cell 230, in accordance with various embodiments of the present invention.

ReRAM is a non-volatile solid-state memory technology that exploits the change in resistance switching of an insulator, such as a binary metal oxide, under an applied electric field. The fundamental storage unit (the "cell") can be programmed into at least two different states, or levels, which exhibit different resistance characteristics. The programmable cell-states can be used to represent different data values, permitting storage of information.

ReRAM architecture typically consists of a resistive switching memory cell having a metal-insulator-metal structure generally referred to as MIM structure. The structure comprises of an insulating layer (I) sandwiched between the two metal (M) electrodes. The application of a voltage pulse across the ReRAM cell enables a transition of the device from an HRS, or OFF state generally referred as logic value '0' to an LRS, or ON state, generally referred as logic value '1' and vice versa.

Typically, an as-prepared ReRAM cell is initially in the HRS and to switch the device from the HRS to the LRS, the application of a forming voltage (e.g., high voltage pulse, write voltage, etc.) enables the formation of CFs in the switching layer whereby the ReRAM cell is switched into the LRS. This process occurs due to the soft breakdown of the metal insulator metal (MIM) structure is usually referred to as 'electroforming' and the voltage at which this process occurs is referred to as forming voltage. To switch the ReRAM cell from the LRS to HRS, a voltage pulse referred to as the RESET voltage is applied.

To read data from ReRAM cell, a read voltage which will not disturb the current state of the cell is applied to determine whether the cell is in the HRS or the LRS. Since both LRS and HRS retain their respective values even after the removal of applied voltage, ReRAM is a non-volatile memory.

The switching of the ReRAM cell is based on the growth of the CF inside the insulating layer. The CF is a channel having a diameter of the order of nanometers which connects the electrodes of the cell. The LRS with high conductivity is obtained when the CF is connected between the electrodes and the HRS results when the filament is disconnected from the electrodes.

The exemplary ReRAM cell 230 includes switching liner 202 located between SC electrodes 104 and pillar electrode 204. The cell state shown represents the LRS state in which CFs 204 have formed within the switching liner 202 and contact, touch, or otherwise connect with both of the SC electrodes 104 and pillar electrode 204. Upon formation of the CFs 204 and respective electrical connection between the SC electrodes 104 and pillar electrode 204, and when a read voltage is applied to read the programmed cell-state, the resulting read current flows primarily via the current path to/from SC electrodes 104 and pillar electrode 204 through the CF 204, in preference to flowing through the high resistance insulator material of the switching liner 202 in which the CFs 204 have not formed.

To write to ReRAM cell 230, a write or forming voltage is applied to SC electrodes 104 or pillar electrode 204 and the resulting programming current through the cell causes breakdown of the switching liner 202 and formation of CFs 204 that connect the SC electrodes 104 and pillar electrode 204, thereby switching the RRAM cell 200 to the LRS from the initial HRS.

Reading of ReRAM cell 230 is performed using cell 230 resistance as a metric for cell-state. A read voltage applied to the SC electrodes 104 or pillar electrode 204 which causes a read current to flow through the cell 230. The read current is dependent on resistance across or between SC electrodes 104 and pillar electrode 204. Measurement of the cell read current therefore provides an indication of the programmed cell 230 state. A sufficiently low read voltage is used for this resistance metric to ensure that application of the read voltage does not disturb the programmed cell state. Cell 230 state detection can then be performed by comparing the resistance metric with predefined reference levels for the programmable cell states. To switch the ReRAM cell 230 from the LRS back to the initial HRS, a voltage pulse referred to as the RESET voltage is applied to SC electrodes 104 or pillar electrode 204.

Figure 2C:
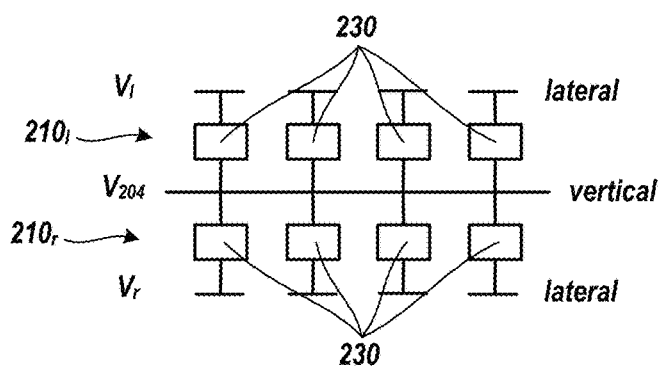
FIG. 2C depicts a circuit diagram of a pair of vertical ReRAM cell banks, in accordance with various embodiments of the present invention.

FIG. 2C depicts a circuit diagram of the pair of vertical resistive memory units $210_l$, $210_r$, in accordance with various embodiments of the present invention. As the vertical resistive memory unit $210_l$ and vertical resistive memory unit $210_r$ share the same pillar electrode 204, they share a circuit node, as depicted. The applied voltage at such node is depicted as $V_{204}$. In embodiments, the applied voltage $V_{204}$ may be a low or ground potential, set or write potential, read potential, reset potential, or the like.

The applied voltage at each SC electrode 104 associated with vertical resistive memory unit $210_l$ is depicted as $V_l$. The applied voltage at each SC electrode 104 associated with vertical resistive memory unit $210_r$ is depicted as $V_r$. In embodiments, the applied voltage, voltage pulse, etc. $V_l$ and $V_r$ may be a high voltage, such as the forming voltage, read voltage, set/reset voltage, or the like. Generally, the SC electrodes 104 are not directly connected in vertical direction. Therefore, each SC electrode 104 may be connected physically, by for example, MC electrodes 108/HRE 108, VIA 420, shown in FIG. 18, or other wiring feature, or may be connected virtually by applying the same bias or potential to the corresponding SC electrodes 104.

It is to be understood that the vertical resistive memory units $210_l$ may therefore be configured as a first bank or grouping of vertically aligned ReRAM cells 230 that are programmed, read, and/or reset as a group (i.e. all vertically aligned ReRAM cells 230 in the vertical resistive memory units $210_l$ experience the same program, write, read, reset, etc. operation). Likewise, the vertical resistive memory units $210_l$ may also be configured as a second bank or grouping of vertically aligned ReRAM cells 230 that are programmed, read, and/or reset as a group.

In embodiments, $V_l$ equals $V_r$. As such, ReRAM cells 230 in both vertical resistive memory units $210_l$, $210_r$ are subjected to the same and simultaneous read, write, reset, etc. operation. In other embodiments, $V_l$ does not equal $V_r$. As such, ReRAM cells 230 in each vertical resistive memory units $210_l$, $210_r$ may be subjected to different and/or simultaneous read, write, reset, etc. operations. For example, ReRAM cells 230 in vertical resistive memory unit $210_l$ may be written to while ReRAM cells 230 in vertical resistive memory unit $210_r$ may be simultaneously read from.

Figure 2D:
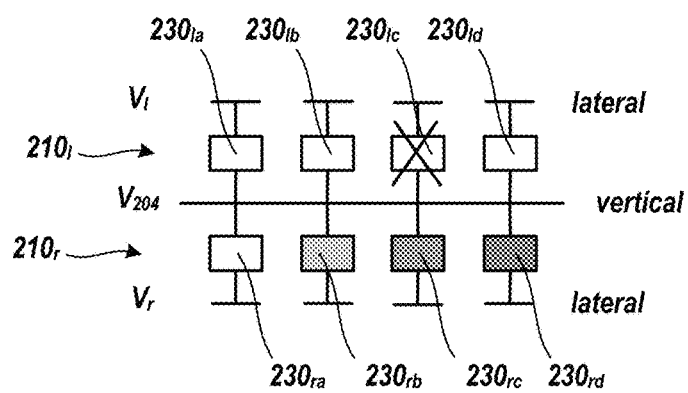
FIG. 2D depicts a circuit diagram of a pair of vertical ReRAM cell banks with inconsistent CF formation therein, in accordance with various embodiments of the present invention.

FIG. 2D depicts a circuit diagram the pair of vertical resistive memory units $210_l$, $210_r$ with inconsistent CF formation within ReRAM cells 230 therein, respectively, in accordance with various embodiments of the present invention.

As indicated herein, inconsistent CF formation may be seen as CF 206 formation failure. This occurs when the ReRAM cell 230 is maintained in its HRS when it has been programmed to be in the LRS (i.e., LRS is intended but the cell 230 stays in the HRS). Inconsistent CF formation may also be seen as CF 206 over formation. This occurs then the ReRAM cell 230 retains the LRS even after it has been subjected to reset operations (i.e. HRS is intended by the cell 230 stays in the LRS). For example, as depicted, CF 206 formation failure may be seen in ReRAM cell $230_l$ relative to the other ReRAM cells $230_{la}$, $230_{lb}$, and $230_{ld}$ in vertical resistive memory unit $210_l$. Such CF 206 formation failure of ReRAM cell $230_{lc}$ may result in the HRS of ReRAM cell $230_{lc}$ while the other ReRAM cells $230_{la}$, $230_{lb}$, and $230_{ld}$ in vertical resistive memory unit $210_l$ are in the LRS. Alternatively, such CF 206 formation failure of ReRAM cell $230_{lc}$ may result in the LRS of ReRAM cell $230_{lc}$ while the other ReRAM cells $230_{la}$, $230_{lb}$, and $230_{ld}$ in vertical resistive memory unit $210_l$ are in the HRS.

Also indicated herein, inconsistent CF formation may be seen as variable CF 206 formation over a range of cells 230. This occurs when the ReRAM cells 230 within vertical resistive memory unit 210 have been subject to writing, reset, or the like, operations and have different or variable resistance values across the range of ReRAM cells 230 within vertical resistive memory unit 210. For example, each ReRAM cell $230_{ra}$, ReRAM cell $230_{rb}$, ReRAM cell $230_{rc}$, and ReRAM cell $230_{rd}$ in vertical resistive memory unit $210_r$ may each be subjected to reset operations and are in the HRS but may have a relatively different resistance thereacross. Similarly, each ReRAM cell $230_{ra}$, ReRAM cell $230_{rb}$, ReRAM cell $230_{rc}$, and ReRAM cell $230_{rd}$ in vertical resistive memory unit 210, may each be subjected to write operations and are resultingly in the LRS but may have a relatively different resistance thereacross.

To limit the effects of inconsistent CF 206 formation of any one or more individual cells 230 within vertical resistive memory unit 210, each of the cells 230 may be subjected to the same simultaneous write, reset, program, or the like, operation. Subsequently, inconsistent CF 206 formation may be experienced by one or more of the cells 230 within vertical resistive memory unit 210.

The group of cells 230 within the vertical resistive memory unit 210 is further read as a group. During the read operation, the resistance values of each respective cell 230 may be combined (e.g., the mean, median, mode, trimmed mean, or the like, of the resistance values may be determined) and the combined resistance value may be used to determine the resistance state (e.g., LRS, HRS, etc.) of all the cells 230 within vertical resistive memory unit 210. Therefore, even if one or more of the cells 230 within the vertical resistive memory unit 210 may have experienced inconsistent CF 206 formation individually, an normalized resistance state of the group of cells 230 may be determined due to the presence or effect of the other cells 230 within the vertical resistive memory unit 210 that have not experienced inconsistent CF 206 formation. The normalized resistance state of the group of cells 230 more accurately indicates the intended LRS or HRS of the cells 230 within the vertical resistive memory unit 210 due to the typically larger number of cells 230 within the unit 210 that have not experienced inconsistent CF 206 formation, that have experienced minor inconsistent CF 206 formation, or the like, relatively to those cells 230 (i.e. outlier cells) within the unit 210 that have experienced inconsistent CF 206 formation that results in a large difference in resistance value relative to the mean resistance value of the cells 230 within the unit 210.

The number of ReRAM cells 230 within the vertical resistive memory unit 210 may be determined from a predetermined acceptable standard deviation of resistance values each cell 230 within the unit 210. If each ReRAM cell 230 within the unit 210 has a random variation of its resistance value thereacross over a mean resistance value of the cells 230 within the unit 210, it has been determined that the standard deviation of the range of resistance values of each cell 230 within the unit 210 is reduced by the number "n" multiplied by the square root of "n," where "n" is the number of the ReRAM cells 230 within the vertical resistive memory unit 210.

Figure 3A:
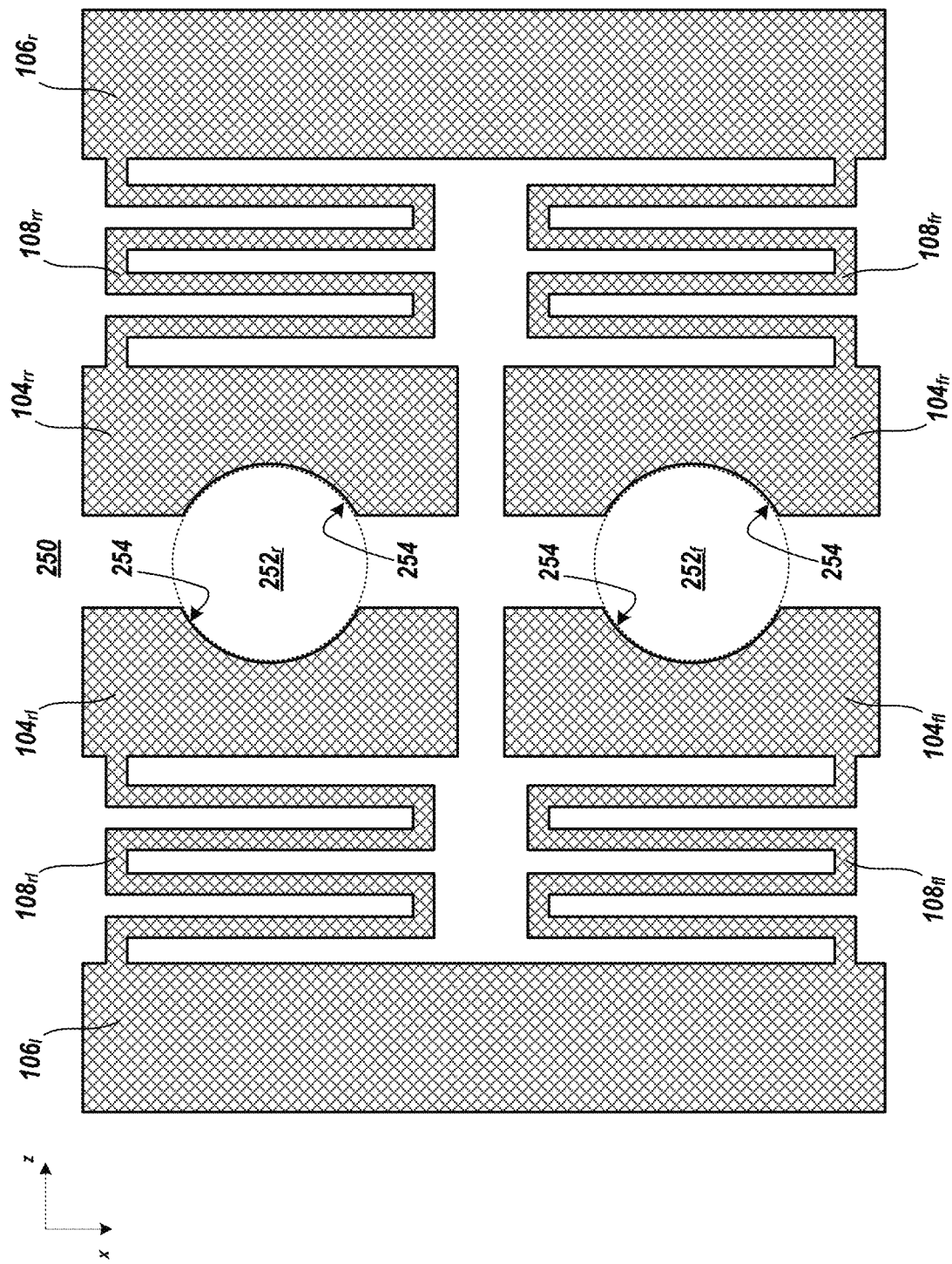
FIG. 3A and FIG. 3B depicts a normal view of a wiring and electrode pattern, in accordance with embodiments of the present invention.
Figure 3B:
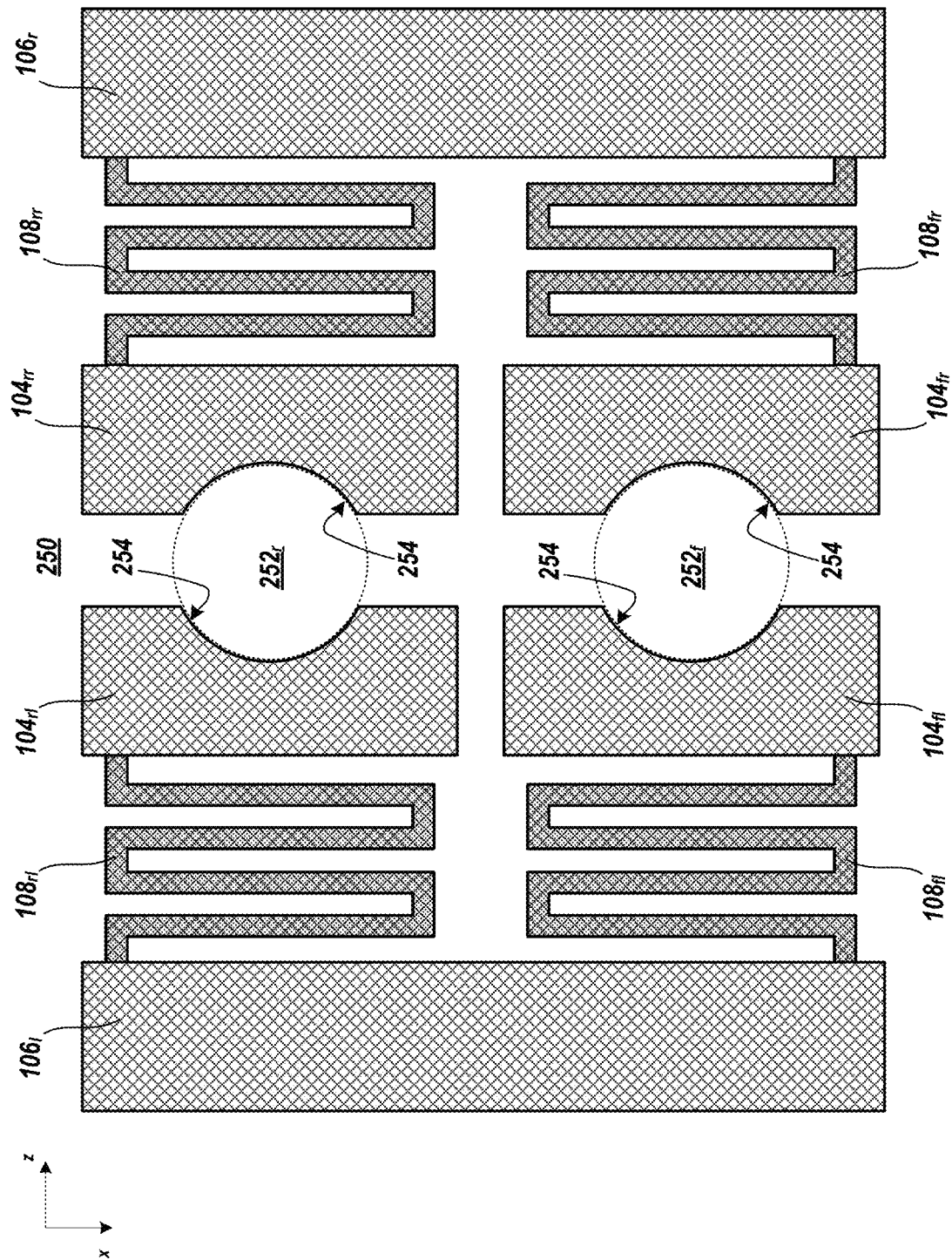

FIG. 3A and FIG. 3B depict a normal view of a wiring and electrode pattern 250, in accordance with embodiments of the present invention. As shown in FIG. 3A, wiring and electrode pattern 250 may be a wiring pattern formed of the first conductor material such that the MC electrodes 106, SC electrodes 104, and HREs 108 are formed of or from the first conductor material. As shown in FIG. 3B, wiring and electrode pattern 250 may be a wiring pattern formed of the first conductor material and the second conductor material such that the MC electrodes 106, and SC electrodes 104 are formed of or from the first conductor material and the HREs 108 are formed of or from the second conductor material.

It is to be understood that HREs 108 may take the form of serpentine wiring connected to a respective SC electrode 104 and a respective MC electrode 106. The HREs 108 may be electrically connected in series to the respective SC electrode 104 and the respective MC electrode 106. HRE 108 serves to reduce, limit, or step down current at the ReRAM cell 230. Typically, if current at the ReRAM cell 230 is too high inconsistent CF 206 formation may be increased. For example, if current through the ReRAM cell 230 is too high, over formation may be more likely, which ultimately may cause the ReRAM cell 230 to become stuck in the HRS. As such, the presence of HRE 108 steps down, reduces, or otherwise limits the current though ReRAM cell 230, relative to current through the ReRAM cell 230 if HRE 108 is not present.

HRE 108 may assist with CF 206 formation by establishing a resistance lower bound or floor which sets or limits current through the ReRAM cell 230. In an illustrative example, an initial voltage of 5 volts is established across ReRAM cell 230 and an associated HRE is 10 kOhm. Initially, all the 5V is dropping across the ReRAM cell 230 before CF 206 is formed as switching liner 202 is infinity or otherwise much higher. Once CF 206 formation starts, the filament path the resistance through switching liner 202 drops. For instance, resistance through switching liner 202 drops to 100 kOhm (total resistance through HRE 108 and switching liner 202 is 110 kOhm). As this point, the voltage drop across switching liner 202 at amount of 5V*10 kOhm/110 kOhm to HRE 108, and 5V*100 kOhm/110 kOhm to the switching liner 202. Over time, CF 206 further grows and now a 10 kOhm filament may be established. Then 5V*10 kOhm/20 kOhm drops across HRE 108, whereas 5V*10 kOhm/20 kOhm drops across the ReRAM cell 230. At this point, 2.5V drops across the CF 206 and the ReRAM cell 230 may not have sufficient voltage drop (or electric field) to induce further movement of the oxygen vacancy. Therefore, CF 206 stops growing or forming. As such, CF 206 formation may be controlled utilizing the HRE 108 external resistance.

HRE 108 may also establish a lower bound to prevent damage due to shorted ReRAM cells 230. If a short is experienced, HRS 108 is effectively a resistance bound to the shorted ReRAM cell 230 so that there is no excessive flux of current flow through the cell 230.

In some implementations, SC electrode 104 may include a partial pillar recess which may be a recess or absence through the SC electrode 104 in the shape associated with the perimeter of ReRAM pillar 102. For example, SC electrode $104_{fl}$, SC electrode $104_{fr}$, SC electrode $104_{rl}$, and SC electrode $104_{rr}$ may each include a partial pillar recess. The partial pillar recesses of neighboring device SC electrodes 104 (i.e. those SC electrodes associated with the same ReRAM pillar 102) may together form a pillar recess 252 associated with the entire perimeter of ReRAM pillar 102. For example, the partial pillar recesses within SC electrode $104_{fl}$ and SC electrode $104_{fr}$, respectively, may together form pillar recess $252_f$ and the partial pillar recesses within SC electrode $104_{rl}$ and SC electrode $104_{rr}$, respectively, may together form pillar recess $252_r$.

The sidewall(s) of the SC electrode 104 that face or otherwise define the pillar recess 252 may be referred herein as a pillar sidewall 254, pillar facing sidewall 254, or the like.

Figure 4:
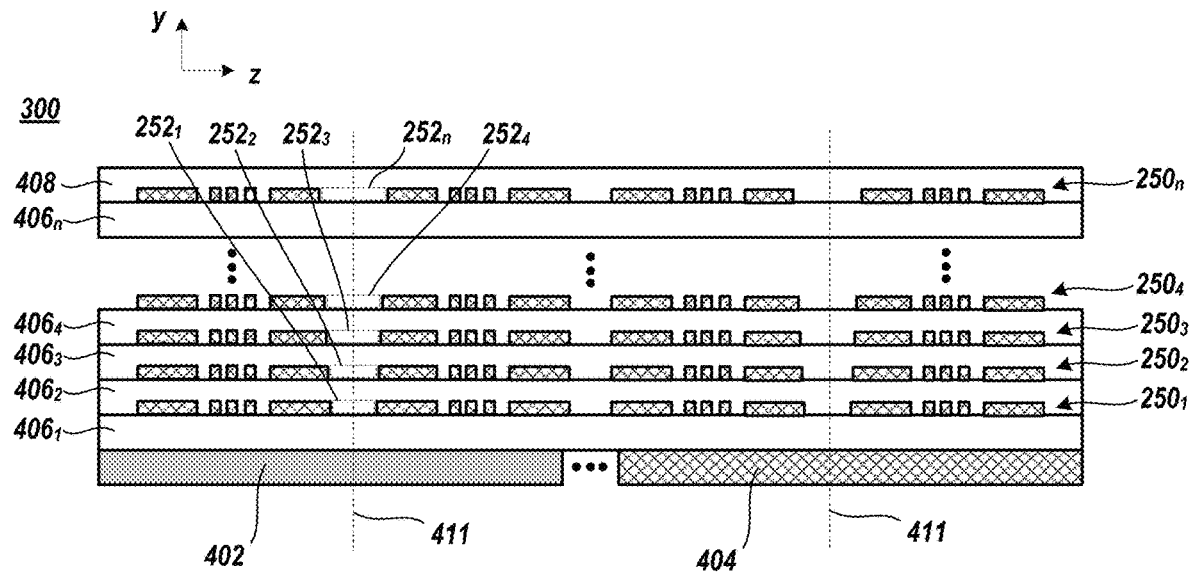
FIG. 4 through FIG. 13 depicts fabrication stages of an integrated circuit device that includes a vertical resistive memory array, in accordance with various embodiments of the present invention.

FIG. 4 depicts a fabrication stage 300 of a method of IC device fabrication, in accordance with various embodiments of the present invention. At stage 300, multiple RRAM levels, each comprising a dielectric layer 406 and a wiring and electrode pattern 250 formed upon the dielectric layer 406, are formed.

For example, a dielectric layer $406_1$ may be formed upon a dielectric layer 402 and/or a metal or conductive layer 404. In some implementations, the dielectric layer 402 and/or a metal or conductive layer 404 may be a top layer of a first bank end of line (BEOL) metallization level.

A wiring and electrode pattern $250_1$ may be formed upon dielectric layer $406_1$. Wiring and electrode pattern $250_1$ may be formed upon dielectric layer $406_1$ by subtractive techniques where undesired conductive material layer portions are removed while desired conductive material layer portions are retained to form the wiring and electrode pattern $250_1$. In an exemplary implementation, a mask (not shown) may be formed upon the conductive material layer (not shown). The mask may be patterned by known photolithography techniques. Portions of the mask may be retained to protect the underlying and desired portions of the conductive material layer. An etchant may remove the undesired portions of the conductive material layer while the protected and desired portions of the conductive material layer are retained. The mask may be removed to expose the desired portions of the conductive material layer that effectively form the wiring and electrode pattern $250_1$.

Wiring and electrode pattern $250_1$ may be formed upon dielectric layer $406_1$ by additive techniques where conductive material(s) are added or deposited upon the dielectric layer $406_1$. In an exemplary implementation, a first mask (not shown) may be formed upon the upon dielectric layer $406_1$. The first mask may be patterned by known photolithography techniques to form first wiring and/or electrode trenches that expose underlying portions of the dielectric layer $406_1$. The first conductive material may be electro plated or otherwise deposited within the first wiring and/or electrode trenches upon the exposed underlying portions of the dielectric layer $406_1$. A second mask (not shown) may be formed upon the first mask and upon the first conductive material. The second mask and the first mask may be patterned by known photolithography techniques to form second wiring and/or electrode trenches that expose underlying portions of the dielectric layer $406_1$. The second conductive material may be electro plated or otherwise deposited within the second wiring and/or electrode trenches upon the exposed underlying portions of the dielectric layer $406_1$. The first mask and second mask may be removed the first conductive material features and second conductive material features are retained. The first conductive material may effectively form SC electrodes 104 and MC electrode(s) 106 and the second conductive material may effectively form the HREs 108.

Another dielectric layer $406_2$ may be formed upon dielectric layer $406_1$ and upon wiring and electrode pattern $250_1$. Another wiring and electrode pattern $250_2$ may be formed upon dielectric layer $406_2$ utilizing subtractive or additive formation techniques. Another dielectric layer $406_3$ may be formed upon dielectric layer $406_2$ and upon wiring and electrode pattern $250_2$. Another wiring and electrode pattern $250_3$ may be formed upon dielectric layer $406_3$ utilizing subtractive or additive formation techniques. Another dielectric layer $406_4$ may be formed upon dielectric layer $406_3$ and upon wiring and electrode pattern $250_3$. Another wiring and electrode pattern $250_4$ may be formed upon dielectric layer $406_4$ utilizing subtractive or additive formation techniques. These processes may continue until dielectric layer $406_n$ is formed upon an underlying dielectric layer 406 and upon an underlying wiring and electrode pattern 250. Another wiring and electrode pattern $250_n$ may be formed upon dielectric layer $406_n$ utilizing subtractive or additive formation techniques. In some implementations, a dielectric layer 408 may be formed upon dielectric layer $406_n$ and upon wiring and electrode pattern $250_n$.

Dielectric layer 406, 408, etc. may octamethylcyclotetrasiloxane (OMCTS), tetraethyl orthosilicate (TEOS), or the like, layer and may have a sheet thickness of 150 nm-1500 nm.

The various wiring and electrode patterns $250_1$ though wiring and electrode pattern $250_n$ may be formed to vertically align the pillar recesses 252 associated with neighboring SC electrodes 104 within each wiring and electrode patterns $250_1$ though wiring and electrode pattern $250_n$. For example, a respective center of a pillar recess $252_1$, pillar recess $252_2$, pillar recess $252_3$, and pillar recess $252_4$ may be oriented, coincident, or the like, upon the same vertical axis 411.

Figure 5:
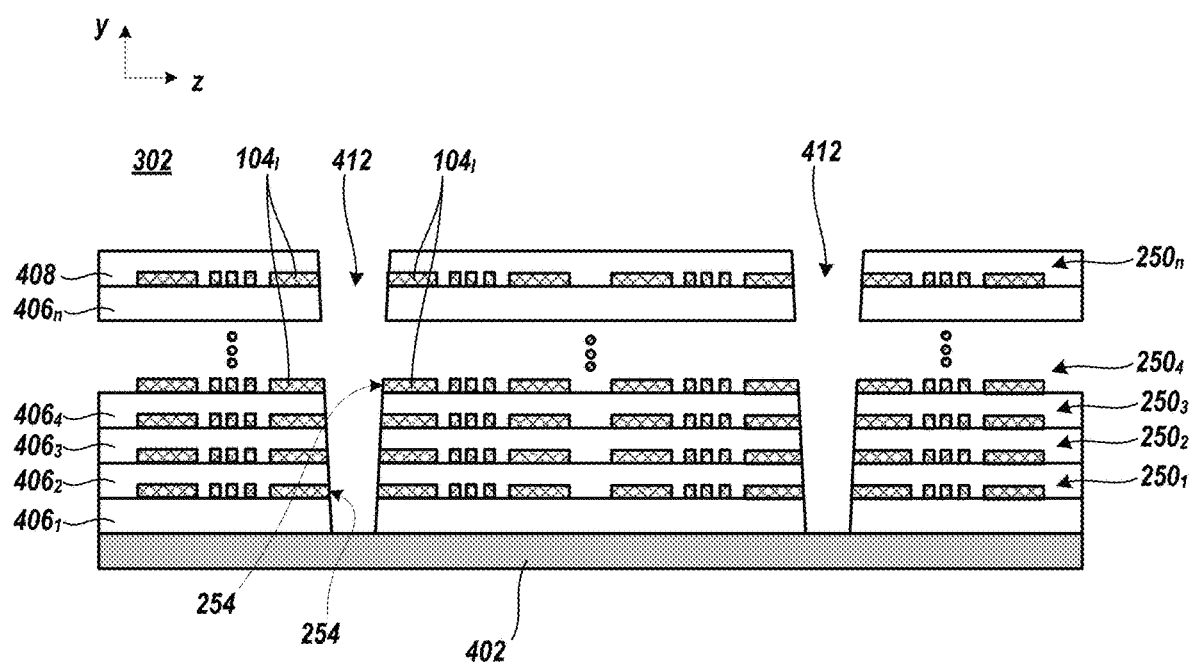

FIG. 5 depicts a fabrication stage 302 of a method of IC device fabrication, in accordance with various embodiments of the present invention. At stage 302, pillar trenches 412 are formed.

Pillar trench 412 may be a trench, hole, well, or the like, formed within the stack of dielectric layers 406, 408 through the vertically aligned pillar trenches 254 that may expose the pillar sidewall 254 of SC electrodes 104. As depicted, pillar trench 412 may expose a portion of the dielectric layer 402.

Pillar trench 412 may be fabricated by subtractive formation techniques where undesired dielectric layers 406, 408 portions are removed. In an exemplary implementation, a mask (not shown) may be formed upon the dielectric layer 408. The mask may be patterned by known photolithography techniques. Portions of the mask may be retained to protect the underlying and desired portions of the dielectric layers 406, 408. The removed portions of the mask may be vertically aligned with the aligned pillar trenches 254. An etchant may remove the undesired portions of the dielectric layers 406, 408 thus forming the pillar trench 412. The mask may be removed. Various known etch techniques may be utilized to form a tapered, angled, or slanted trench 412 sidewall, relative to the x-z plane or to form a trench 412 sidewall orthogonal to the x-y plane.

Figure 6:
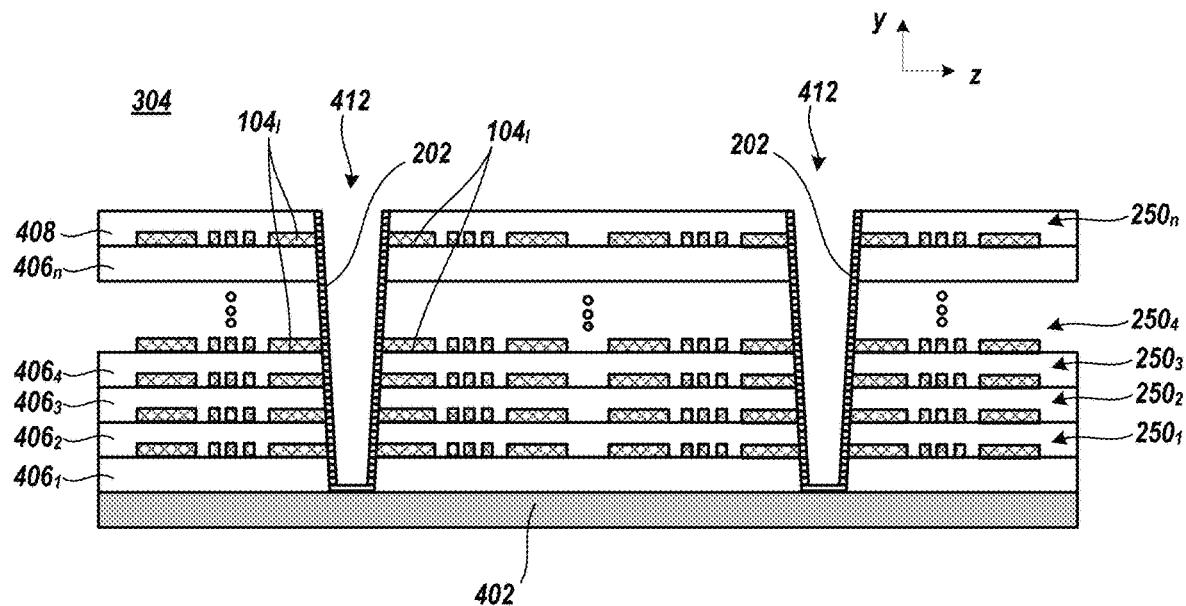

FIG. 6 depicts a fabrication stage 304 of a method of IC device fabrication, in accordance with various embodiments of the present invention. At stage 304, switching liner 202 is formed within pillar trench 412.

Switching liner 202 may be formed by known additive formation techniques. For example, switching liner 202 may be formed upon the trench 412 sidewall(s) and lower surface by chemical vapor deposition (CVD) or the like.

Switching liner 202 may be a $H_fO_x$, $WO_x$, $TaO_x$, $TiO_x$, $NiO_x$, $SiO_x$, GeS, GeSe, or the like, layer and may have a thickness of 1 nm-30 nm.

Figure 7:
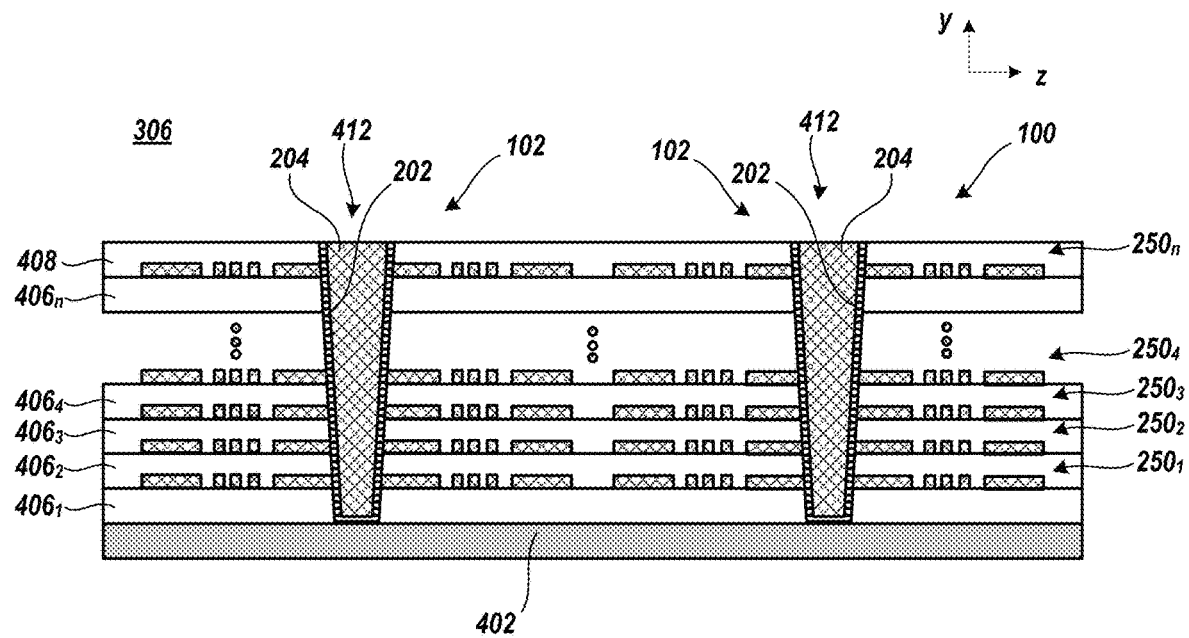

FIG. 7 depicts a fabrication stage 306 of a method of IC device fabrication, in accordance with various embodiments of the present invention. At stage 306, pillar electrode 204 is formed upon the switching liner 202 within pillar trench 412.

Pillar electrode 204 may be formed upon the switching liner 202 within pillar trench 412 by additive techniques where a conductive material is added or deposited. In an exemplary implementation, a mask (not shown) may be formed upon the upon dielectric layer 408. The mask may be patterned by known photolithography techniques to form openings above the pillar trenches 412. The conductive material may be electro plated or otherwise deposited within pillar trench 412 upon the switching liner 202. The mask may be removed and a chemical mechanical polish (CMP) may planarize the top surface of the pillar electrode 204 with the top surface of dielectric layer 408. It is to be understood, upon the formation of pillar electrode 204 upon the switching liner 202, a ReRAM pillar 102 is thereby formed.

Figure 8:
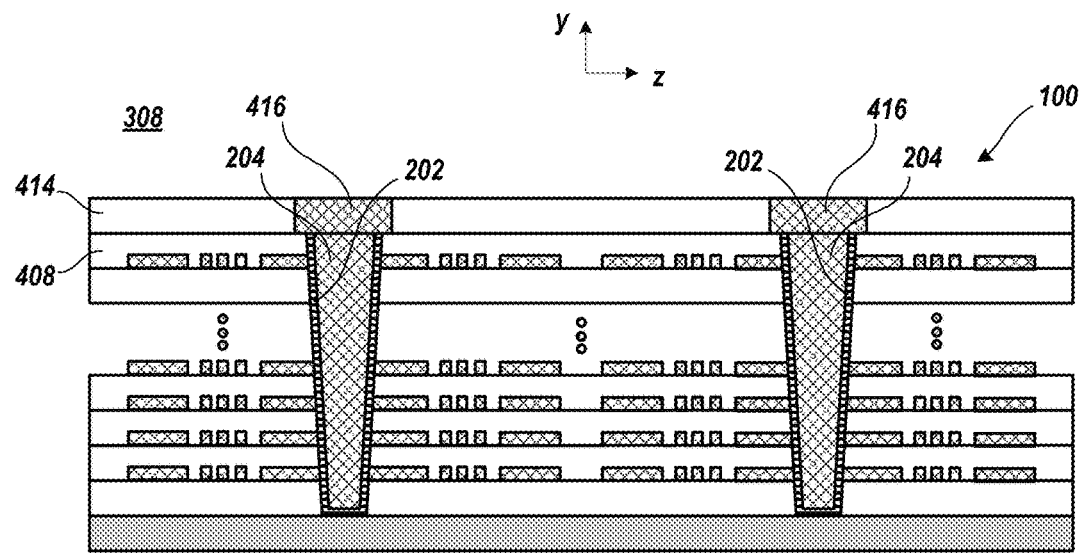

FIG. 8 depicts a fabrication stage 308 of a method of IC device fabrication, in accordance with various embodiments of the present invention. At stage 308, dielectric layer 414 is formed upon dielectric layer 408 and a wire 416 if formed within the dielectric layer 414.

In some implementations, the dielectric layer 414 may be a bottom layer of a second BEOL metallization level.

Wire 416 may be formed within dielectric layer 414. A wiring trench may be formed within dielectric layer 414 by subtractive techniques where undesired dielectric layer 414 portions are removed, thereby forming a wiring pattern, while desired dielectric layer 414 portions are retained. In an exemplary implementation, a mask (not shown) may be formed upon the dielectric layer 414. The mask may be patterned by known photolithography techniques. An etchant may remove the undesired portions of the dielectric layer 414. The mask may be removed to expose portions of the upper surface of dielectric 408 and expose the upper surface of the ReRAM pillar 102.

Wire 416 may be formed within dielectric layer 414 by additive techniques where conductive material(s) are added or deposited within the wiring trench in dielectric layer 414. In an exemplary implementation, a mask (not shown) may be formed upon the upon dielectric layer 414. The mask may be patterned by known photolithography techniques to remove portions above the wiring trench. The conductive material may be electro plated or otherwise deposited within the wiring trenches within dielectric 414 upon the exposed underlying portions of the ReRAM pillar 102. The mask may be removed, and a CMP may planarize the top surface of wire 416 and the upper surface of dielectric layer 414.

Figure 9:
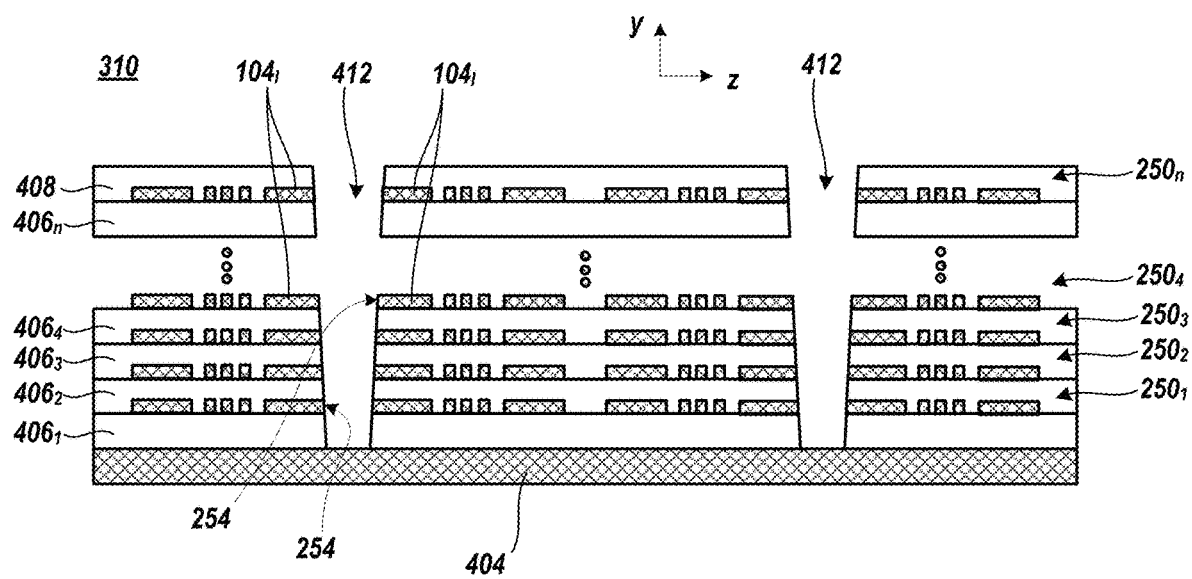

FIG. 9 depicts a fabrication stage 310 of a method of IC device fabrication, in accordance with various embodiments of the present invention. At stage 310, pillar trenches 412 are formed. Pillar trench 412 may be a trench, hole, well, or the like, formed within the stack of dielectric layers 406, 408 through the vertically aligned pillar trenches 254 that may expose the pillar sidewall 254 of SC electrodes 104 and a portion of the upper surface of metal or conductive layer 404.

Figure 10:
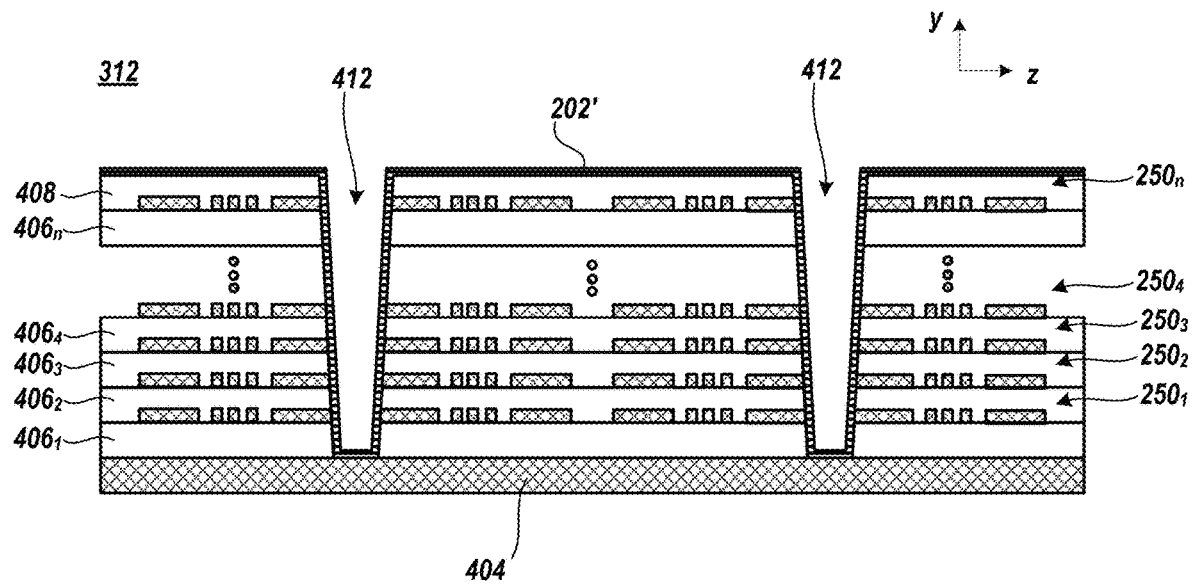

FIG. 10 depicts a fabrication stage 312 of a method of IC device fabrication, in accordance with various embodiments of the present invention. At stage 312, switching liner layer 202' is formed within pillar trench 412 and upon the dielectric layer 408.

Switching liner 202 may be formed by known additive formation techniques. For example, switching liner layer 202' may be formed upon the dielectric layer 408 and upon the trench 412 sidewall(s) and lower surface by atomic layer deposition (ALD), physical vapor deposition (PVD), or the like. Switching liner layer 202' may be a $H_fO_x$, $WO_x$, $TaO_x$, $TiO_x$, $NiO_x$, $SiO_x$, GeS, GeSe layer and may have a sheet thickness of 1 nm-30 nm.

Figure 11:
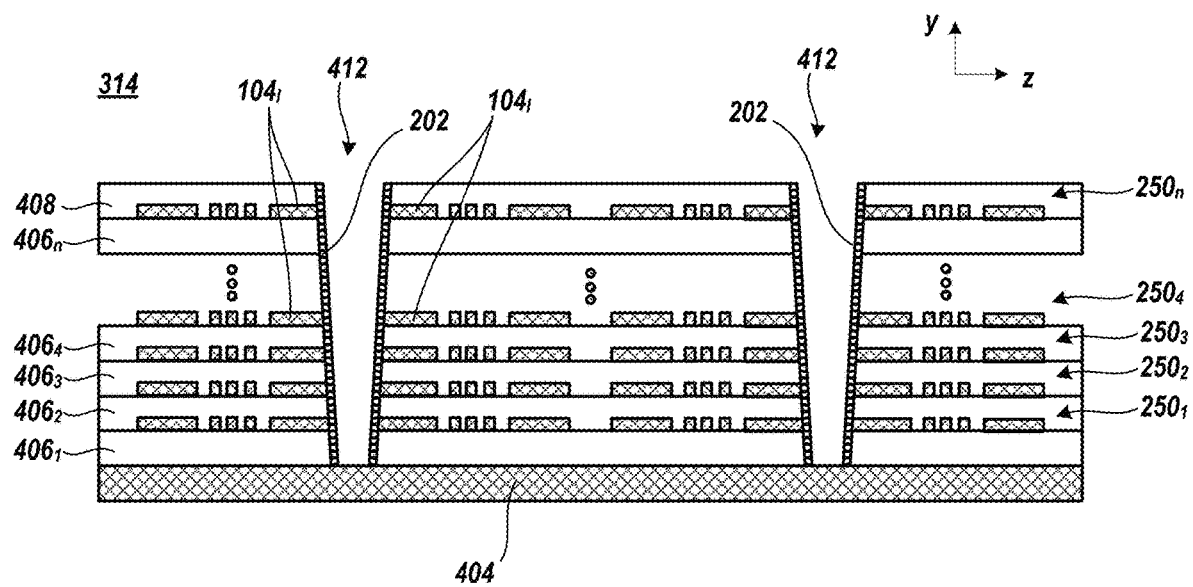

FIG. 11 depicts a fabrication stage 314 of a method of IC device fabrication, in accordance with various embodiments of the present invention. At stage 314, switching liner layer 202' is partially removed from the upper surface of dielectric layer 408 and from the upper surface of metal or conductor layer 404 while is retained upon the sidewalls of pillar trench 412, thereby forming switching liner 202.

Switching liner layer 202' may be partially removed by subtractive techniques where undesired switching liner layer 202' portions are removed, while desired switching liner layer 202' portions are retained to form switching liner 202. In an exemplary implementation, a directional etch technique may be utilized to remove the undesired switching liner layer 202' from the upper surface of dielectric layer 408 and from the bottom of pillar trench 412. The etch generally exposes a portion of the metal layer 404 within the pillar trench 412.

Figure 12:
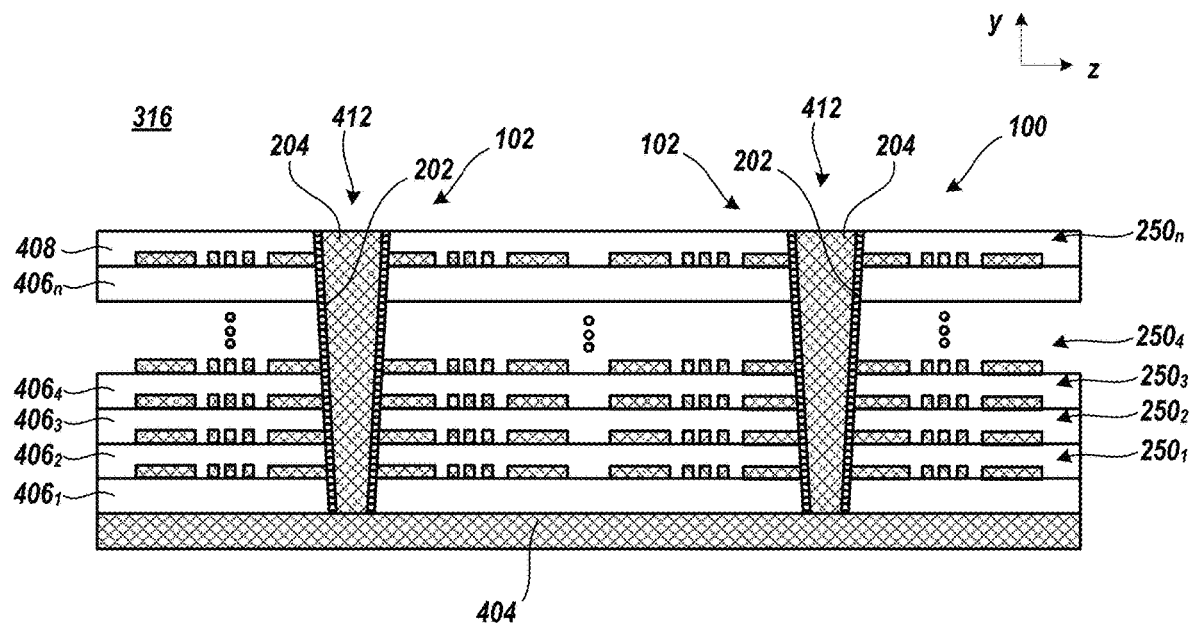

FIG. 12 depicts a fabrication stage 316 of a method of IC device fabrication, in accordance with various embodiments of the present invention. At stage 316, pillar electrode 204 is formed upon the switching liner 202 and upon the metal layer 404 within pillar trench 412.

Pillar electrode 204 may be formed upon the switching liner 202 and upon the metal layer 404 within pillar trench 412 by additive techniques where a conductive material is added or deposited. In an exemplary implementation, a mask (not shown) may be formed upon the upon dielectric layer 408. The mask may be patterned by known photolithography techniques to form openings above the pillar trenches 412. The conductive material may be electro plated or otherwise deposited within pillar trench 412 upon the switching liner 202 and upon the metal layer 404. The mask may be removed and a chemical mechanical polish (CMP) may planarize the top surface of the pillar electrode 204 with the top surface of dielectric layer 408. It is to be understood, upon the formation of pillar electrode 204 upon the switching liner 202, a ReRAM pillar 102 is thereby formed.

Figure 13:
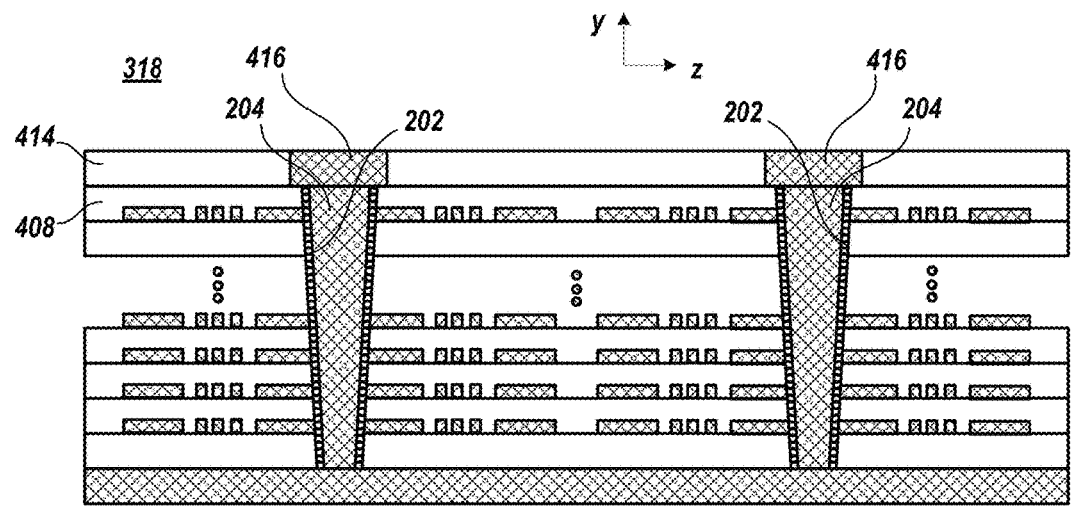

FIG. 13 depicts a fabrication stage 318 of a method of IC device fabrication, in accordance with various embodiments of the present invention. At stage 318, dielectric layer 414 is formed upon dielectric layer 408 and a wire 416 if formed within the dielectric layer 414.

In some implementations, the dielectric layer 414 may be a bottom layer of a second BEOL metallization level.

Wire 416 may be formed within dielectric layer 414. A wiring trench may be formed within dielectric layer 414 by subtractive techniques where undesired dielectric layer 414 portions are removed, thereby forming a wiring pattern, while desired dielectric layer 414 portions are retained. In an exemplary implementation, a mask (not shown) may be formed upon the dielectric layer 414. The mask may be patterned by known photolithography techniques. An etchant may remove the undesired portions of the dielectric layer 414. The mask may be removed to expose portions of the upper surface of dielectric 408 and expose the upper surface of the ReRAM pillar 102.

Wire 416 may be formed within dielectric layer 414 by additive techniques where conductive material(s) are added or deposited within the wiring trench in dielectric layer 414. In an exemplary implementation, a mask (not shown) may be formed upon the upon dielectric layer 414. The mask may be patterned by known photolithography techniques to remove portions above the wiring trench. The conductive material may be electro plated or otherwise deposited within the wiring trenches within dielectric 414 upon the exposed underlying portions of the ReRAM pillar 102. The mask may be removed, and a CMP may planarize the top surface of wire 416 and the upper surface of dielectric layer 414.

It is to be understood that the wire 416 and dielectric layer 414 structure may take the place of conductor or metal layer 404. In other words, instead of a potential plane conductor or metal layer 404, a wiring level with the structure of wire 416 and dielectric layer 414 may be used as the base layer in which formation of the IC device may occur. In these implementations, the ReRAM pillar 102 may contact the upper wire 416, as depicted, as well as this lower base wire, as described.

Figure 14:
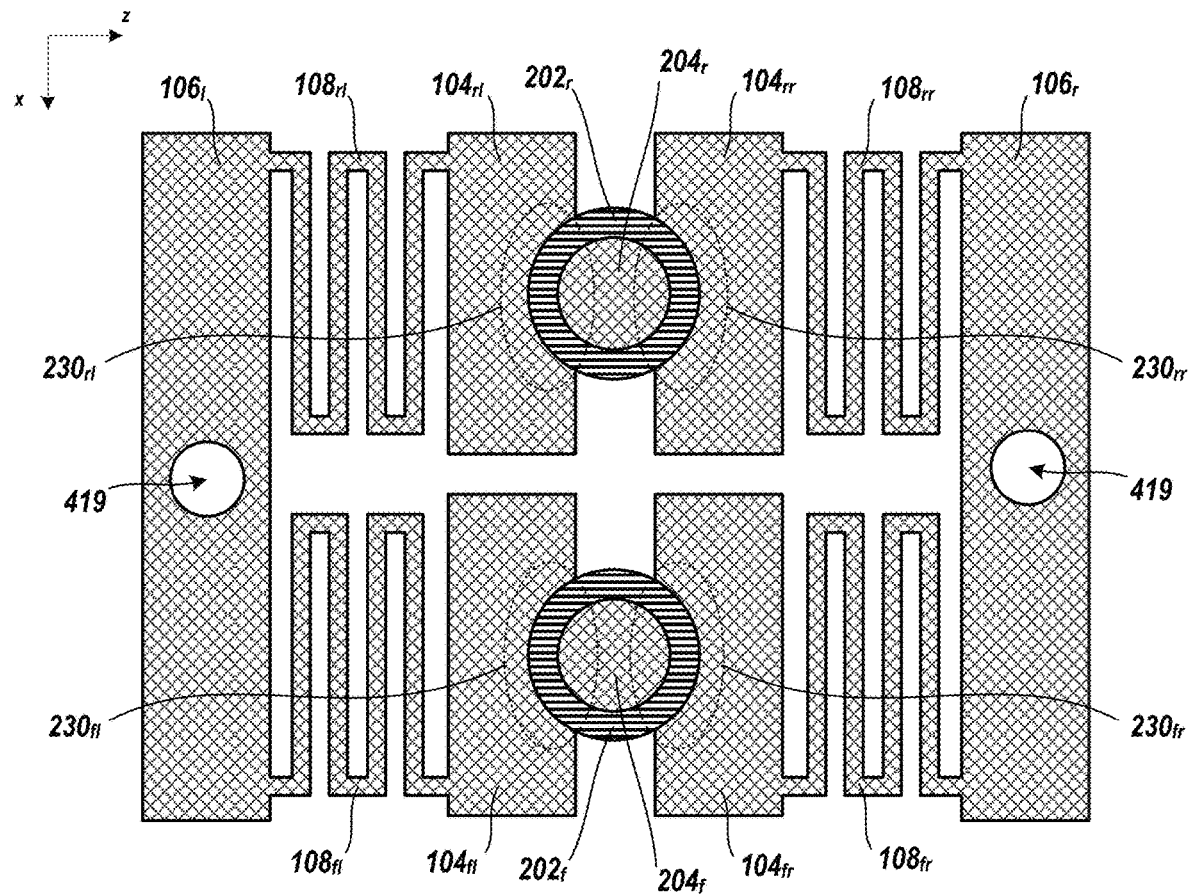
FIG. 14 depicts a normal view of a level of a vertical resistive memory array, in accordance with various embodi

FIG. 14 depicts a normal view of a level of a vertical resistive memory array 100, in accordance with various embodiments of the present invention. The level of the vertical resistive memory array 100 includes wiring and electrode pattern 250 with ReRAM pillars 102 formed within or in place of pillar recess 252, respectively.

For example, ReRAM pillar $102_r$ comprising the pillar electrode $204_r$ and switching liner $202_r$ has been formed within or in place of pillar recess $252_r$ and ReRAM pillar $102_f$ comprising the pillar electrode $204_f$ and switching liner $202_f$ has been formed within or in place of pillar recess $252_f$. The ReRAM pillar $102_r$ in combination with the respective SC electrodes 104 forms ReRAM cell $230_{rl}$ on a first side of the ReRAM pillar $102_{rr}$ and an ReRAM cell $230_{rr}$ on a second side of the ReRAM pillar $102_r$, forms ReRAM cell $230_{fl}$ on a first side of the ReRAM pillar $102_f$ and an ReRAM cell $230_{fr}$ on a second side of the ReRAM pillar $102_{fr}$.

In some implementations MC electrode 106 includes a VIA recess 419. The VIA recesses 419 within each level the vertical resistive memory array 100 may be vertically aligned and may generally define the positioning of a VIA that may connect MC electrode 106 within the various levels of the vertical resistive memory array 100.

Figure 15:
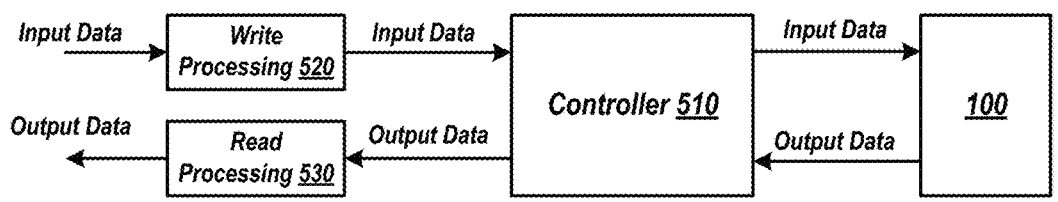
- FIG. 15 depicts a block diagram of a memory device embodying a vertical resistive memory array, in accordance with various embodiments of the present invention.

FIG. 15 depicts a block diagram of a memory 500 device embodying the vertical resistive memory array 100, in accordance with various embodiments of the present invention. Device 500 includes vertical resistive memory array 100 for storing data in and/or reading data from. Reading and writing of data to vertical resistive memory array 100 may be performed by a read/write controller, or controller, 510. Controller 510 includes circuitry of generally known form for programming appropriate vertically aligned cells 230 in memory unit 210 during data write operations and making read measurements for detecting respective cell 230 state of the vertical resistive memory unit 210 during data read operations. During these operations, the read/write controller 510 can address individual vertical resistive memory units 210 by applying appropriate control signals to array 100 word and bit lines. Input data, or data to be written, to device 500 may be subjected to some form of write-processing, such as coding for error-correction purposes, by write-processing module 520, before being supplied as input data to controller 510. Similarly, output data, or data read, by controller 510 may be processed by a read-processing module 530, e.g., for codeword detection and/or error correction, to recover the original input data.

The vertical resistive memory array 100 can store information in, for example, two programmable cell 230 states. As discussed earlier, the programmable cell states correspond to different relative resistances across respective cells 230. These states include at least an HRS and an LRS. The programmable cell 230 states are typically defined in controller 510 in terms of predetermined reference values, or ranges of values, of a combined resistance metric of the vertical resistive memory unit 210 used for read detection. To program the vertical resistive memory unit 210 in a write operation, controller 510 applies a corresponding voltage to e.g. MC electrodes 106 such that a write voltage, set voltage, program voltage, or the like is applied at SC electrodes 104 and e.g. a ground/low potential at pillar electrode 204 such that the resulting programming signal sets the associated cells 230 are set to the required state (e.g., LRS).

In a read operation, a (lower) read voltage is applied to the vertical resistive memory unit 210 and the resulting current through those cells 230 is measured to obtain the resistances of those cell 230. Controller 510 can then detect the programmed cell 230 state of the vertically aligned cells 230 by combining the measured resistances of those cell 230 and comparing the combined measured resistances with the aforementioned appropriate reference value(s).

In a reset operation, controller 510 applies a voltage to the vertical resistive memory unit 210 so that a corresponding reset voltage is applied at SC electrodes 104 and e.g. a ground/low potential at pillar electrode 204 such that the resulting reset signal effectively resets the associated cells 230 back to the HRS state.

Figure 16:
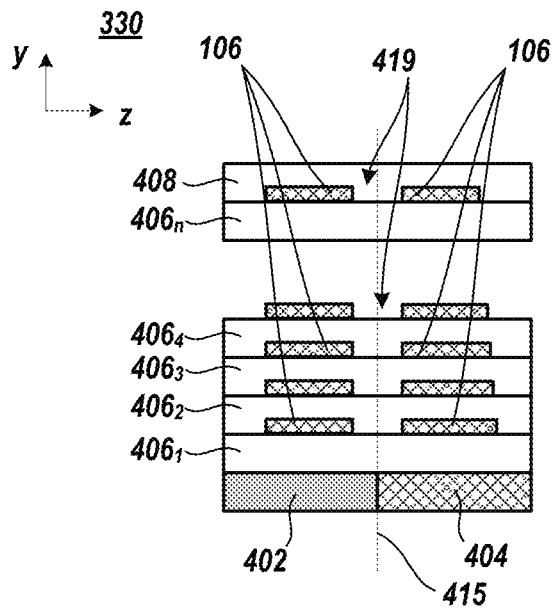
FIG. 16 through FIG. 19 depicts fabrication stages of an integrated circuit device that includes a vertical resistive memory array, in accordance with various embodiments of the present invention.

FIG. 16 depicts a fabrication stage 330 of a method of IC device fabrication, in accordance with various embodiments of the present invention. At stage 330, multiple RRAM levels, each comprising a dielectric layer 406, and a wiring and electrode pattern 250 formed upon the dielectric layer 406, are formed. In some implementations, stage 330 may be the same stage 300.

The various wiring and electrode patterns $250_1$ though wiring and electrode pattern $250_n$ may be formed to vertically align the VIA recesses 419 within vertically aligned MC electrodes 106. For example, a respective center of a VIA recess $419_1$, VIA recess $419_2$, VIA recess $419_3$, and VIA recess $419_4$ may be oriented, coincident, or the like, upon the same vertical axis 415.

Figure 17:
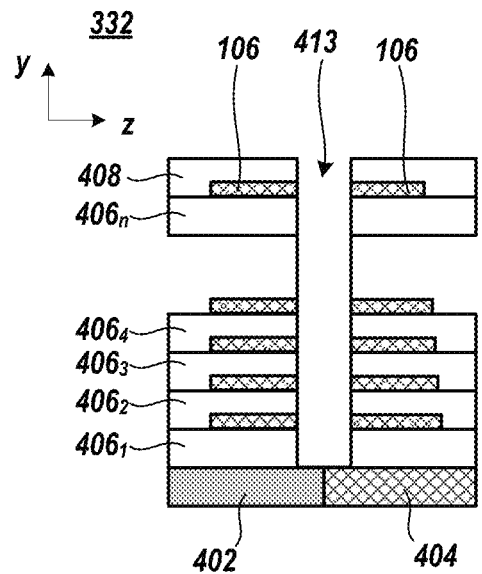

FIG. 17 depicts a fabrication stage 332 of a method of IC device fabrication, in accordance with various embodiments of the present invention. At stage 332, VIA trenches 413 are formed. In some implementations, stage 332 may be the same stage 302 or stage 310.

VIA trench 413 may be a trench, hole, well, or the like, formed within the stack of dielectric layers 406, 408 through the vertically aligned VIA recesses 419. As depicted, pillar trench 412 may expose a portion of the dielectric layer 402 or the metal or conductor layer 404.

VIA trench 413 may be fabricated by subtractive formation techniques where undesired dielectric layers 406, 408 portions are removed. In an exemplary implementation, a mask (not shown) may be formed upon the dielectric layer 408. The mask may be patterned by known photolithography techniques. Portions of the mask may be retained to protect the underlying and desired portions of the dielectric layers 406, 408. The removed portions of the mask may be vertically aligned with the aligned VIA recesses 419. An etchant may remove the undesired portions of the dielectric layers 406, 408 thus forming the VIA trench 413. The mask may be removed. Various known etch techniques may be utilized to form a tapered, angled, or VIA trench 413 sidewall, relative to the x-z plane or to form a VIA trench 413 sidewall orthogonal to the x-y plane.

Figure 18:
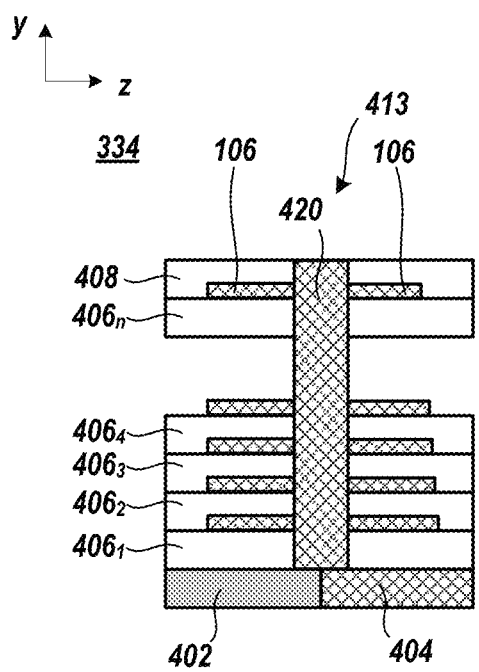

FIG. 18 depicts a fabrication stage 334 of a method of IC device fabrication, in accordance with various embodiments of the present invention. At stage 334, VIA 420 is formed within VIA trench 413 and upon the dielectric layer 402 or upon the conductor or metal layer 404. In some implementations, stage 334 may come prior to stage 304 or 312 so that switching liner 202 or switching liner layer 202' is not formed within the VIA trench 413.

VIA 420 may be formed within VIA trench 413 by additive techniques where a conductive material is added or deposited. In an exemplary implementation, a mask (not shown) may be formed upon the upon dielectric layer 408. The mask may be patterned by known photolithography techniques to form openings above the VIA trenches 413. The conductive material may be electro plated or otherwise deposited within VIA trench 413 contacting the VIA recesses 419 sidewalls of the MC electrode 106 and contacting the dielectric layer 402 or the conductor or metal layer 404. The mask may be removed and a chemical mechanical polish (CMP) may planarize the top surface of the VIA 420 with the top surface of dielectric layer 408.

Figure 19:
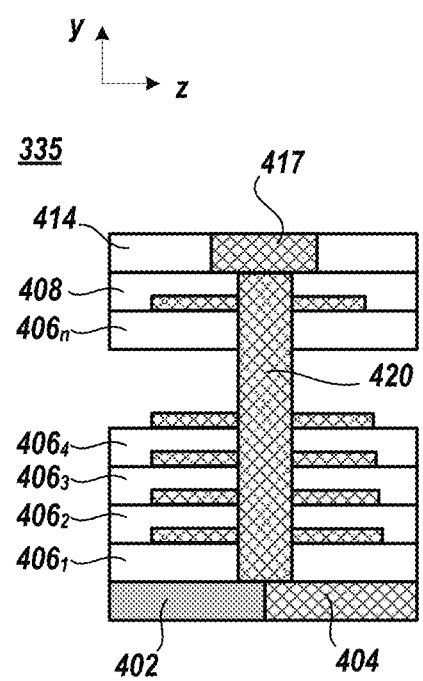

FIG. 19 depicts a fabrication stage 335 of a method of IC device fabrication, in accordance with various embodiments of the present invention. At stage 335, dielectric layer 414 is formed upon dielectric layer 408 and a wire 417 if formed within the dielectric layer 414. In some implementations, stage 335 may be the same stage 308 or stage 318.

Wire 417 may be formed within dielectric layer 414. A wiring trench may be formed within dielectric layer 414 by subtractive techniques where undesired dielectric layer 414 portions are removed, thereby forming a wiring pattern, while desired dielectric layer 414 portions are retained. In an exemplary implementation, a mask (not shown) may be formed upon the dielectric layer 414. The mask may be patterned by known photolithography techniques. An etchant may remove the undesired portions of the dielectric layer 414. The mask may be removed to expose portions of the upper surface of dielectric 408 and expose the upper surface of VIA 420.

Wire 417 may be formed within dielectric layer 414 by additive techniques where conductive material(s) are added or deposited within the wiring trench in dielectric layer 414. In an exemplary implementation, a mask (not shown) may be formed upon the upon dielectric layer 414. The mask may be patterned by known photolithography techniques to remove portions above the wiring trench. The conductive material may be electro plated or otherwise deposited within the wiring trenches within dielectric 414 upon the exposed underlying portions of the VIA 420. The mask may be removed, and a CMP may planarize the top surface of wire 417 and the upper surface of dielectric layer 414.

Figure 20:
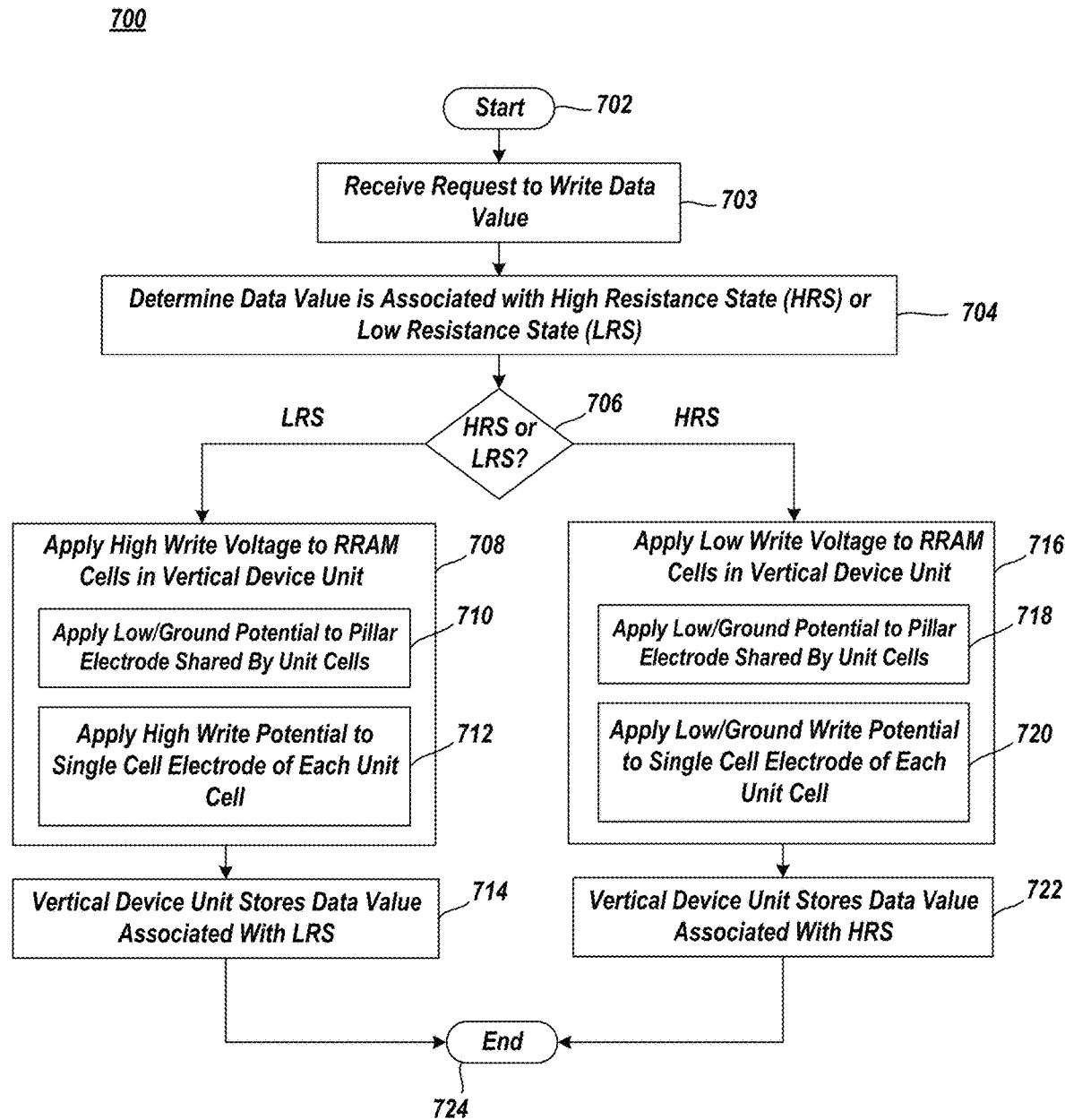
FIG. 20 depicts a method of writing data to a vertical resistive memory array, in accordance with various embodiments of the present invention.

FIG. 20 depicts a method 700 of writing data to a vertical resistive memory array 100, in accordance with various embodiments of the present invention. Method 700 may be accomplished by controller 500, a controller unit within a processor, or other known memory array controller. Method 700 begins at block 702 and may continue with receiving a request to write a data value (block 703). For example, controller 500 may receive a request from a processor or other requesting device to write a data value (e.g. a high "1" or a low "0") to a particular single cell.

Method 700 may continue with determining whether the data value is associated with the HRS or the LRS (block 704, 706). For example, if the data value is a high "1" the LRS is indicated and if the data value is low "0", the HRS is indicated. Therefore, if the data value associated with the write request is a high "1", the controller 500 determines that it needs to program vertical resistive memory unit 210 in the LRS. Likewise, if the data value associated with the write request is a low "0", the controller 500 determines that it needs to program, maintain, etc. vertical resistive memory unit 210 in the HRS.

Method 700 may continue if the LRS has been determined with applying a high write voltage to the vertical resistive memory unit 210 (block 708). For example, controller 500 applies a voltage to MC electrode 106 that corresponds to a high write voltage at SC electrode 104 (block 712) and applies a ground/low voltage to pillar electrode 204 that is associated with the SC electrode 104 (block 710). Alternatively, controller 500 may apply a ground or low voltage to MC electrode 106 which corresponds to ground or low voltage at SC electrode 104 and applies a high voltage to pillar electrode 204.

Method 700 may continue with the corresponding current through the respective cells 230 within vertical resistive memory unit 210 programs (pending any inconsistent CF 206 formation) programming each of those cells 230 in the LRS such that they effectively store the data value high "1" (block 714).

Method 700 may continue if the HRS has been determined with applying a low write voltage, ground voltage, or the like to the vertical resistive memory unit 210 (block 716). For example, controller 500 applies a ground/low voltage to MC electrode 106 that corresponds to a ground or low write voltage at SC electrode 104 (block 720) and applies a ground/low voltage to pillar electrode 204 that is associated with the SC electrode 104 (block 718). Alternatively, controller 500 may apply a ground or low voltage to MC electrode 106 which corresponds to ground or low voltage at SC electrode 104 and may apply a low or ground voltage to pillar electrode 204.

Method 700 may continue with the corresponding low or no current through the respective cells 230 within the vertical resistive memory unit 210 programs (pending any inconsistent CF 206 formation) each of those cells 230 in the HRS such that they effectively store the data value low "0" (block 722). Method 700 may end at block 724.

It is to be understood that the controller 500 may receive the request to store the particular data value in the single or particular cell and may resulting program the cells 230 in the vertical resistive memory unit 210 with that data value.

Figure 21:
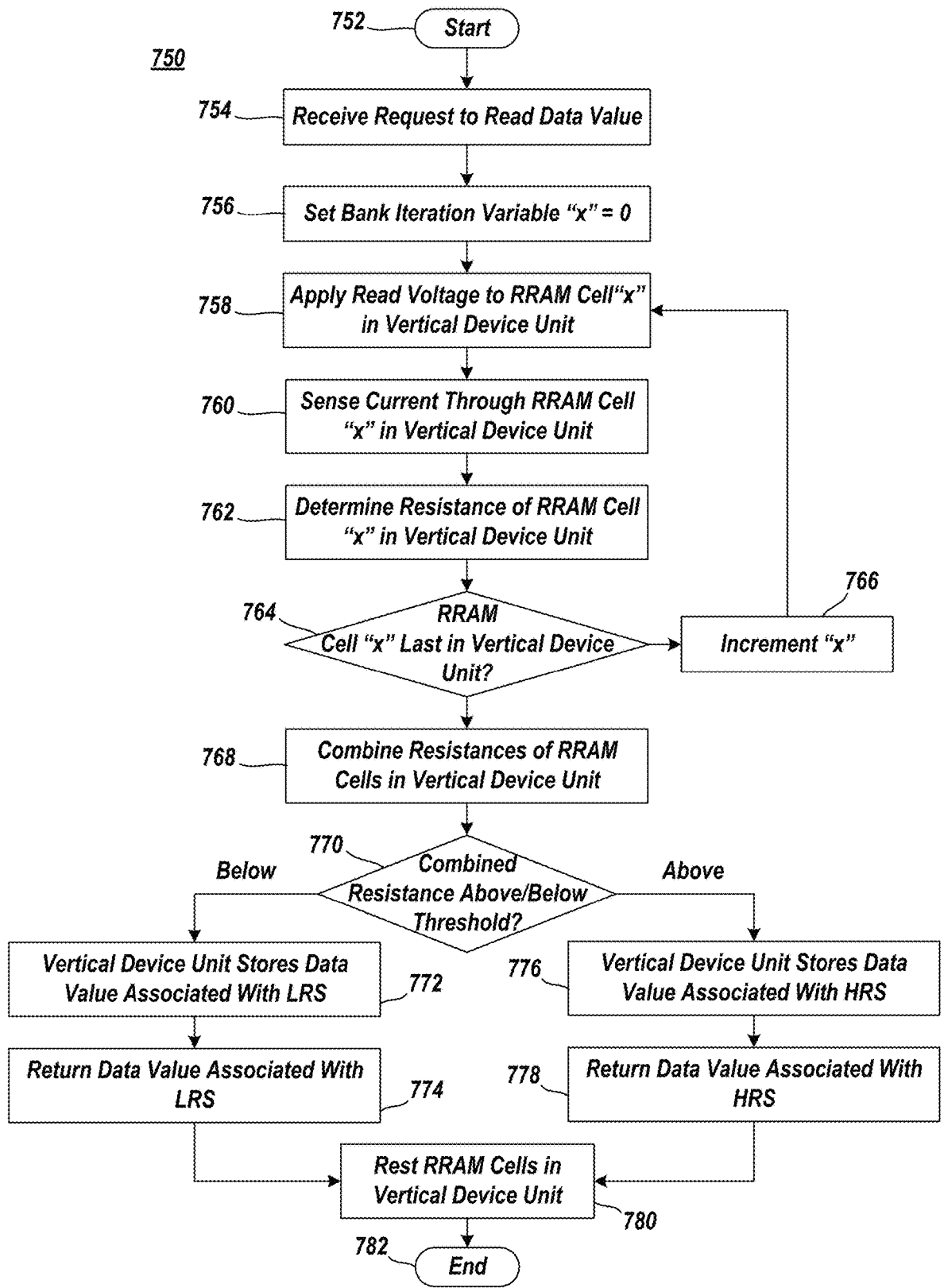
FIG. 21 depicts a method of reading data from a vertical resistive memory array, in accordance with various embodiments of the present invention.

FIG. 21 depicts a method 750 of reading data from a vertical resistive memory array, in accordance with various embodiments of the present invention. Method 750 may be accomplished by controller 500, a controller unit within a processor, or other known memory array controller. Method 750 begins at block 752 and may continue with receiving a request to read a data value (block 754). For example, controller 500 may receive a request to read a data value (e.g. a high "1" or a low "0") from a particular single cell.

Method 750 may continue with determining the resistance across each cell 230 within a vertical resistive memory unit 210. In an exemplary implementation, the resistances of each 230 within the vertical resistive memory unit 210 may be determined by setting a bank iteration variable "x" equal to 0 (block 756).

Method 750 may continue with applying a read voltage to the ReRAM cell "x" within the vertical resistive memory unit 210 (block 758). For example, the controller 500 applies a voltage to MC 106 so that a corresponding read voltage is applied at SC electrode "x" and applies a low/ground voltage to pillar electrode 204. Alternatively, the controller 500 applies a read voltage to pillar electrode and applies a ground/low potential at SC electrode "x".

Method 750 may continue with sensing the current through ReRAM cell "x" within the vertical resistive memory unit 210 (block 760). For example, controller 500 measures or senses the current through ReRAM cell "x" as a result of the applied read voltage.

Method 750 may continue with determining the resistance of ReRAM cell "x" within the vertical resistive memory unit 210 from the sensed current through ReRAM cell "x" (block 762). For example, controller 500 determines the resistance of ReRAM cell "x" from the sensed current through ReRAM cell "x".

Method 750 may continue with determining whether ReRAM cell "x" is the last within the vertical resistive memory unit 210 (block 764). If ReRAM cell "x" is the not the last within the vertical resistive memory unit 210, the bank iteration variable "x" is incremented (block 766) and method 750 returns to block 758 until the resistance of each cell 230 in the vertical resistive memory unit 210 have been determined. As depicted, by applying the loop of blocks 758, 760, 762, 764, 766 may be serially performed. Alternatively, such loop may be performed in parallel in order to determine the respective resistance of each of the cells 230 within the vertical resistive memory unit 210 simultaneously.

Method 750 may continue with combining the determined resistances of the ReRAM cells within the vertical resistive memory unit 210 (block 768). For example, the controller 500 may calculate the mean resistance of the determined resistances of the ReRAM cells within the vertical resistive memory unit 210, the controller 500 may calculate the median resistance of the determined resistances of the ReRAM cells within the vertical resistive memory unit 210, the controller 500 may calculate the mode resistance of the determined resistances of the ReRAM cells within the vertical resistive memory unit 210. In a particular implementation, the controller 500 may calculate a trimmed median resistance of the determined resistances of the ReRAM cells within the vertical resistive memory unit 210 where a predetermined quantity or percentage of the highest determined resistances and/or a predetermined quantity or percentage of the lowest determined resistances are discarded in determining the trimmed median resistance value. For example, if ten ReRAM cells 230 are in a vertical resistive memory unit 210, the controller 500 may drop or otherwise discard the highest one determined resistance and the lowest determined resistance of the ReRAM cell 230 group and calculate the mean resistance over a range of eight values. The combined resistance value (e.g. mean, median, mode, trimmed mean, or the like) determined at block 768, that combines the determined resistance values of each of the ReRAM cells 230 within the vertical bank or group is herein defined as the combined resistance.

Method 750 may continue with determining whether the combined resistance is above or below a predetermined threshold (block 770). The predetermined threshold may be the expected or theoretical resistance metric associated with the ReRAM cells 230 in the vertical resistive memory unit 210 where, if the combined resistance is above the threshold, a weighting, majority, or the like of the cells 230 within the vertical resistive memory unit 210 are essentially programmed in the HRS, and if the combined resistance is below the threshold a weighting, majority, or the like the cells 230 within the vertical resistive memory unit 210 are essentially programed in the LRS.

If the combined resistance is below the threshold, method 750 may continue with effectively determining that the vertical resistive memory unit 210 stores a data value associated with the LRS (block 772). For example, controller 500 may determine that the vertical resistive memory unit 210 stores a high "1" if the combined resistance is below the threshold. Method 750 may continue with returning the data value associated with the LRS to the requesting device (block 774). For example, controller 500 may return a high "1" data value to the requesting device (e.g. processor, or the like).

If the combined resistance is above the threshold, method 750 may continue with effectively determining that the vertical resistive memory unit 210 stores a data value associated with the HRS (block 776). For example, controller 500 may determine that the vertical resistive memory unit 210 stores a low "0" if the combined resistance is above the threshold. Method 750 may continue with returning the data value associated with the LRS to the requesting device (block 778). For example, controller 500 may return a high "1" data value to the requesting device (e.g. processor, or the like).

Method 750 may continue with resetting the cells 230 within the vertical resistive memory unit 210 if a reset operation is requested (block 780). For example, the controller 500 may receive a reset request. The controller 500 may then reset the cells 230 within the vertical resistive memory unit 210 by, for example, applying a reset voltage to the associated SC electrodes 104 and applying a ground/low voltage to the shared pillar electrode 204. Method 750 may end at block 782. Alternatively, the controller 500 may reset the cells 230 within the vertical resistive memory unit 210 by, for example, applying a reset voltage to the pillar electrode 204 and applying a ground/low voltage to the associated SC electrodes 104. Method 750 may end at block 782.

It is to be understood that the controller 500 may receive a request to return a particular data value in a single or particular cell and may resulting read the cells 230 in the vertical resistive memory unit 210 in order to ascertain the collective data value stored in the vertical resistive memory unit 210 and return that value to the requesting device.

Figure 22:
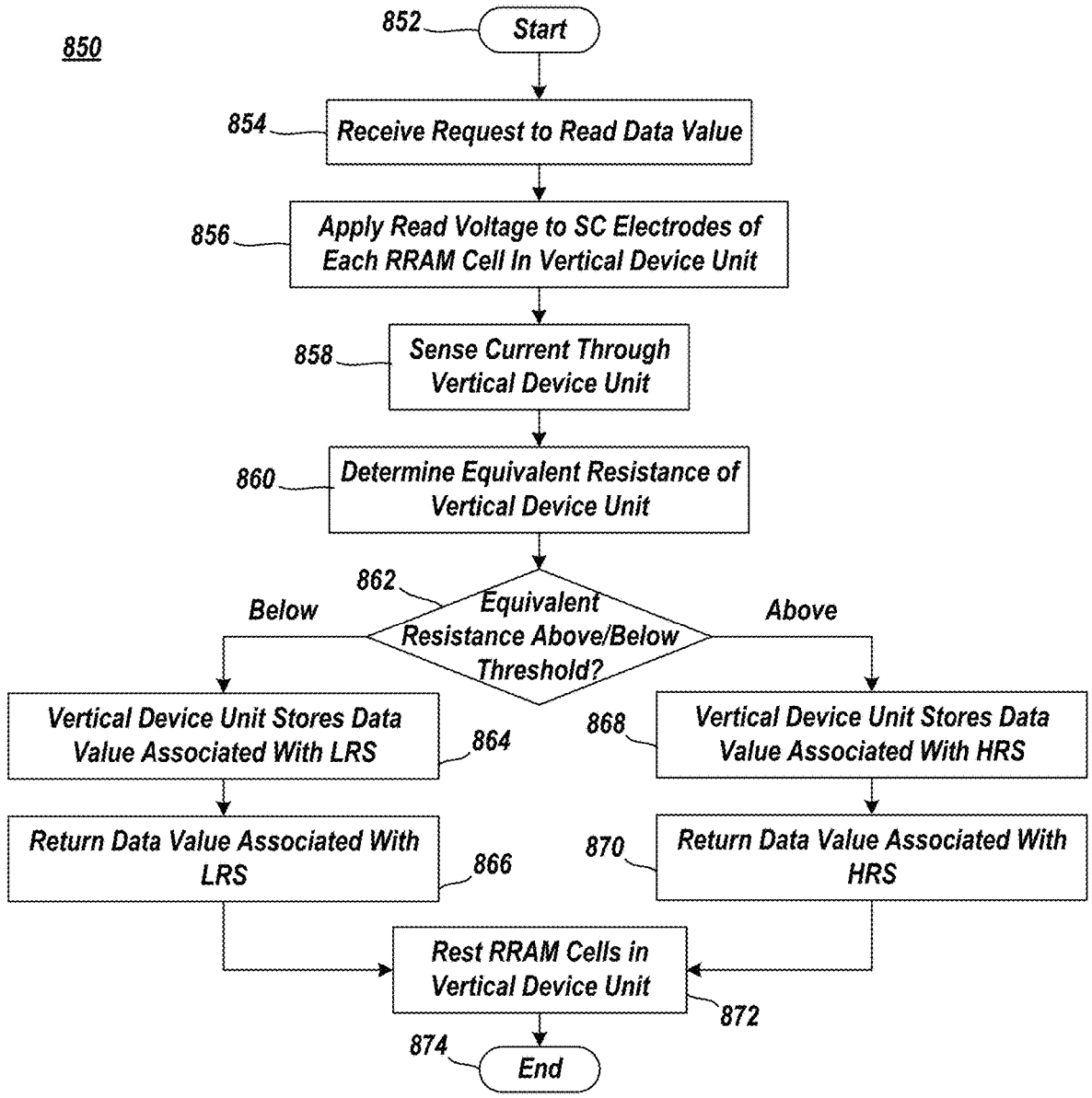
FIG. 22 depicts a method of reading data from a vertical resistive memory array, in accordance with various embodiments of the present invention.

FIG. 22 depicts a method 850 of reading data from a vertical resistive memory array, in accordance with various embodiments of the present invention. Method 850 may be accomplished by controller 500, a controller unit within a processor, or other known memory array controller. Method 850 begins at block 852 and may continue with receiving a request to read a data value (block 854). For example, controller 500 may receive a request from a processor or other requesting device to read a data value (e.g. a high "1" or a low "0") from a particular single cell.

Method 850 may continue with determining the resistance across the vertical resistive memory unit 210. This may be accomplished by applying a read voltage to each SC electrode 104 of the cells 230 within the vertical resistive memory unit 210 (block 856). For example, the controller 500 applies a voltage to MC 106 so that a corresponding read voltage is applied at each SC electrode 104 of the cells 230 within the vertical resistive memory unit 210.

Method 850 may continue with sensing the current through the vertical resistive memory unit 210 (block 858). For example, controller 500 measures or senses the current through vertical resistive memory unit 210 as a result of the applied read voltage at each SC electrode of the cells 230 within the vertical resistive memory unit 210.

Method 850 may continue with determining the equivalent resistance of vertical resistive memory unit 210 from the sensed current through vertical resistive memory unit 210 (block 860). For example, controller 500 determines the equivalent resistance of vertical resistive memory unit 210 from the sensed current through vertical resistive memory unit 210.

Method 850 may continue with determining whether the equivalent resistance is above or below a predetermined threshold (block 862). The predetermined threshold may be the expected or theoretical resistance metric associated with the ReRAM cells 230 in the vertical resistive memory unit 210 where, if the equivalent resistance is above the threshold, a weighting, majority, or the like of the cells 230 within the vertical resistive memory unit 210 are essentially programmed in the HRS, and if the equivalent resistance is below the threshold a weighting, majority, or the like the cells 230 within the vertical resistive memory unit 210 are essentially programed in the LRS.

If the equivalent resistance is below the threshold, method 850 may continue with effectively determining that the vertical resistive memory unit 210 stores a data value associated with the LRS (block 864). For example, controller 500 may determine that the vertical resistive memory unit 210 stores a high "1" if the equivalent resistance is below the threshold. Method 850 may continue with returning the data value associated with the LRS to the requesting device (block 866). For example, controller 500 may return a high "1" data value to the requesting device (e.g. processor, or the like).

If the equivalent resistance is above the threshold, method 850 may continue with effectively determining that the vertical resistive memory unit 210 stores a data value associated with the HRS (block 868). For example, controller 500 may determine that the vertical resistive memory unit 210 stores a low "0" if the equivalent resistance is above the threshold. Method 850 may continue with returning the data value associated with the LRS to the requesting device (block 870). For example, controller 500 may return a high "1" data value to the requesting device (e.g. processor, or the like).

Method 850 may continue with resetting the cells 230 within the vertical resistive memory unit 210 if a reset operation is requested (block 872). For example, the controller 500 may receive a reset request. The controller 500 may then reset the cells 230 within the vertical resistive memory unit 210 by, for example, applying a reset voltage to the associated SC electrodes 104 and applying a ground/low voltage to the shared pillar electrode 204. Alternatively, the controller 500 may reset the cells 230 within the vertical resistive memory unit 210 by, for example, applying a reset voltage to the pillar electrode 204 and applying a ground/low voltage to the associated SC electrodes 104. Method 750 may end at block 782. Method 850 may end at block 874.

It is to be understood that the controller 500 may receive a request to return a particular data value in a single or particular cell and may resulting read the vertical resistive memory unit 210 in order to ascertain the collective data value stored in the vertical resistive memory unit 210 and return that value to the requesting device.

Figure 23:
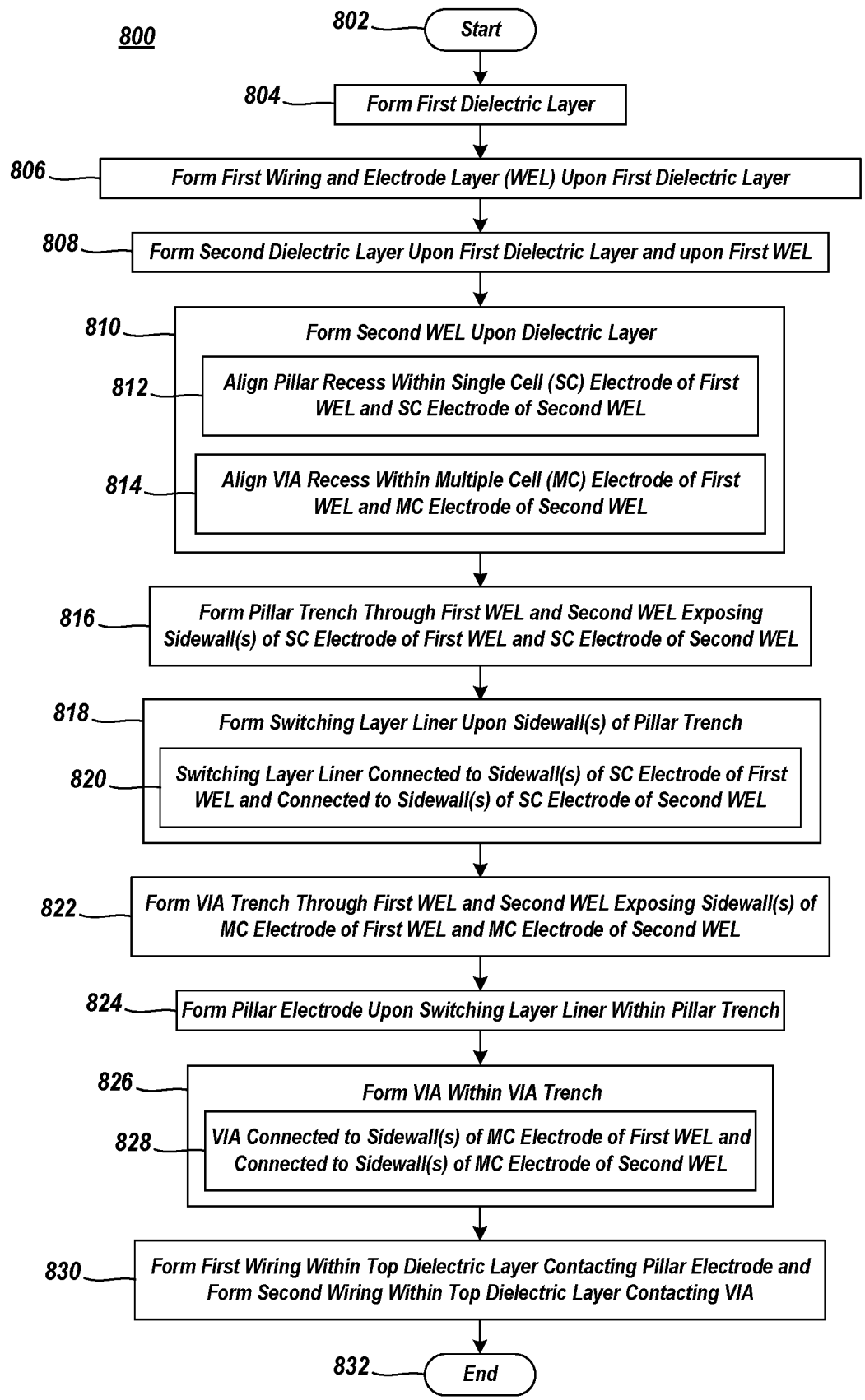
FIG. 23 depicts a method of fabricating an integrated circuit device that includes a vertical resistive memory array, in accordance with various embodiments of the present invention.

FIG. 23 depicts a method 800 of fabricating an IC device that includes a vertical resistive memory array 100, in accordance with various embodiments of the present invention. Method 800 may be utilized to fabricate an IC device such as a processor, memory, ASIC, FPGA, or the like.

Method 800 begins at block 802 and continues with forming a first dielectric layer (block 804). For example, dielectric layer 406₁ is formed upon a dielectric layer 402, conductor or metal layer 404, or the like.

Method 800 may continue with forming a first wiring and electrode layer upon the first dielectric layer (block 806). For example, wiring and electrode pattern 250₁ is formed upon dielectric layer 406₁.

Method 800 may continue with forming a second dielectric layer upon the first wiring and electrode layer and upon the first dielectric layer (block 808). For example, dielectric layer 406₂ is formed upon wiring and electrode pattern 250₁ and upon dielectric layer 406₁.

Method 800 may continue with forming a second wiring and electrode layer upon the second dielectric layer (block 810). For example, wiring and electrode pattern 250₂ is formed upon dielectric layer 406₂. A pillar recess associated with the SC electrode of the first wiring and electrode layer may be vertically aligned with a pillar recess associated with the SC electrode of the second wiring and electrode layer (block 812). For example, pillar recess 252₁ associated with the SC electrode 104₁ of the wiring and electrode pattern 250₁ may be vertically aligned with a pillar recess 252₂ associated with the SC electrode 104₂ of the second wiring and electrode pattern 250₂. A VIA recess associated with the MC electrode of the first wiring and electrode layer may be vertically aligned with a VIA recess associated with the SC electrode of the second wiring and electrode layer (block 814). For example, VIA recess 419₁ associated with the MC electrode 106₁ of the wiring and electrode pattern 250₁ may be vertically aligned with a VIA recess 419₂ associated with the MC electrode 106₂ of the second wiring and electrode pattern 250₂.

Method 800 may continue with forming a pillar trench through the first wiring and electrode layer and through the second wiring and electrode layer thereby exposing pillar sidewall(s) of the SC electrode of the first wiring and electrode layer and pillar sidewall(s) of the SC electrode of the second wiring and electrode layer (block 816). For example, pillar trench 412 is formed through the wiring and electrode pattern 250₁, wiring and electrode pattern 250₂, dielectric layer 406₂, and dielectric layer 406₁. The pillar trench 412 exposes pillar sidewall(s) 254₁ of the SC electrode 104₁ and pillar sidewall(s) 254₂ of the SC electrode 104₂. The pillar trench 412 may also expose a portion of the underlying dielectric layer 402, a portion of the underling conductor or metal layer 404, a portion of the underling conductor or wire, or the like.

Method 800 may continue with forming a switching liner upon the sidewalls of the pillar trench (block 818). For example, switching liner 202 is formed upon the sidewalls of the pillar trench 412. The switching liner 202 may be further formed upon the lower surface of the pillar trench 412, or in other words, on the portion of the dielectric layer 402 exposed by the pillar trench 412. The switching liner is connected to the pillar sidewall(s) of the SC electrode of the first wiring and electrode layer and the pillar sidewall(s) of the SC electrode of the second wiring and electrode layer (block 820). For example, the switching liner 202 may contact the exposed pillar sidewall(s) 254₁ of the SC electrode 104₁ and also contact the exposed pillar sidewall(s) 254₂ of the SC electrode 104₂.

Method 800 may continue with forming a VIA trench through the first wiring and electrode layer and the second wiring and electrode layer thereby exposing sidewall(s) of the MC electrode of the first wiring and electrode layer and sidewall(s) of the MC electrode of the second wiring and electrode layer (block 822). For example, VIA trench 413 is formed through the wiring and electrode pattern 250₁, wiring and electrode pattern 250₂, dielectric layer 406₂, and dielectric layer **406*i*. The VIA trench 413 exposes VIA recess 419 sidewall(s) of the MC electrode 106₁ and VIA recess 419 sidewall(s) of the MC electrode 106₂. The VIA trench 413 may also expose a portion of the underlying dielectric layer 402, a portion of the underling conductor or metal layer 404**, a portion of the underling conductor or wire, or the like.

Method 800 may continue with forming a pillar electrode upon the switching liner within the pillar trench (block 824). For example, pillar electrode 204 is formed upon the switching liner 202 within the pillar trench 412.

Method 800 may continue with forming a VIA within the VIA trench (block 826). For example, VIA 420 is formed within VIA trench 413. The VIA is connected to the VIA recess sidewall(s) of the MC electrode of the first wiring and electrode layer and the VIA recess sidewall(s) of the MC electrode of the second wiring and electrode layer (block 828). For example, VIA 420 contacts the exposed VIA recess 419 sidewall(s) of the MC electrode 106₁ and also contact the exposed VIA recess 419 sidewall(s) of the MC electrode 106₂.

Method 800 may continue with forming a first wiring feature with a top dielectric layer that contacts the pillar electrode and forming a second wiring feature within the top dielectric layer that contacts the VIA (block 830). For example, dielectric layer 408 is formed upon the dielectric layer 406₂. A wire 416 is formed within the dielectric layer 408 that contacts the pillar electrode 204 and a wire 417 is formed within the dielectric layer 408 that contacts the VIA 420. Method 800 may end at block 832.

It is to be understood that the fabrication stages described herein or in the various blocks depicted in FIG. 23 need not occur in the order presented and may occur in an order to efficiently fabricate the IC device that includes the includes a vertical resistive memory array 100 as described herein.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication or verification of IC chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

References herein to terms such as "vertical", "horizontal", and the like, are made by way of example, and not by way of limitation, to establish a frame of reference. The term "horizontal" as used herein is defined as a plane parallel to the conventional plane or surfaces of dielectric layer 402, metal or conductor layer 404, etc., regardless of the actual spatial orientation of the IC device. The term "vertical" refers to a direction perpendicular to the horizontal, as just defined. Terms, such as "on", "above", "below", "side" (as in "sidewall"), "higher", "lower", "over", "top", "under", "beneath", and the like, are defined with respect to the horizontal plane. It is understood that various other frames of reference may be employed for describing the present invention without departing from the spirit and scope of the present invention.

What is claimed is:

1. A vertical resistive memory array comprising:
   a front vertical resistive memory unit comprising a front resistive random access memory (RRAM) pillar and a first vertically stacked electrode group connected to a first side of the front RRAM pillar;
   the front RRAM pillar comprising a first pillar electrode and a first switching liner around and contacting a sidewall perimeter of the first pillar electrode; and
   the first vertically stacked electrode group comprising a first upper single cell (SC) electrode in direct contact with a first upper high resistance element (HRE) and in direct contact with only the front RRAM pillar by the first upper SC electrode contacting the first switching liner and a first lower SC electrode in direct contact with a first lower HRE and in direct contact with only the front RRAM pillar by the first lower SC electrode contacting the first switching liner.

2. The vertical resistive memory array of claim 1, wherein the front vertical resistive memory unit further comprises:
   a second vertically stacked electrode group connected to a second side of the front RRAM pillar, the second vertically stacked electrode group comprising a second upper SC electrode in direct contact with a second upper HRE and in direct contact with only the front RRAM pillar by the second upper SC electrode contacting the first switching liner and a second lower SC electrode in direct contact with a second lower HRE and in direct contact with only the front RRAM pillar by the second lower SC electrode contacting the first switching liner.

3. The vertical resistive memory array of claim 2, further comprising:
   a rear vertical resistive memory unit comprising a rear RRAM pillar and a third vertically stacked electrode group connected to a first side of the rear RRAM pillar;
   the rear RRAM pillar comprising a second pillar electrode and a second switching liner around a sidewall perimeter of the second pillar electrode; and
   the third vertically stacked electrode group comprising a third upper SC electrode in direct contact with a third upper HRE and in direct contact with only the rear RRAM pillar by the third upper SC electrode contacting the second switching liner and a third lower SC electrode in direct contact with a third lower HRE and in direct contact with only the rear RRAM pillar by the third lower SC electrode contacting the second switching liner.

4. The vertical resistive memory array of claim 3, wherein the rear vertical resistive memory unit further comprises:
   a fourth vertically stacked electrode group connected to a second side of the rear RRAM pillar, the fourth vertically stacked electrode group comprising a fourth upper SC electrode in direct contact with a fourth upper HRE and in direct contact with only the rear RRAM pillar by the fourth upper SC electrode contacting the second switching liner and a fourth lower SC electrode in direct contact with a fourth lower HRE and in direct contact with only the rear RRAM pillar by the fourth lower SC electrode contacting the second switching liner.

5. The vertical resistive memory array of claim 4, comprising a first upper multi cell (MC) electrode connected to the first upper HRE and connected to the third upper HRE.

6. The vertical resistive memory array of claim 5, comprising a second upper MC electrode connected to the second upper HRE and connected to the fourth upper HRE.

7. The vertical resistive memory array of claim 6, comprising a first lower MC electrode connected to the first lower HRE and connected to the third lower HRE.

8. The vertical resistive memory array of claim 7, comprising a second lower MC electrode connected to the second lower HRE and connected to the fourth lower HRE.

* * * * *